(12) United States Patent
Chen et al.

(10) Patent No.: US 11,194,751 B2
(45) Date of Patent: Dec. 7, 2021

(54) POWER MANAGEMENT OF RE-DRIVER DEVICES

(71) Applicant: Intel Corporation, Santa Clara, CA (US)

(72) Inventors: Huimin Chen, Beaverton, OR (US); Jingbo Li, Portland, OR (US); Kai Xiao, Portland, OR (US); Yong Yang, Portland, OR (US); Chunfei Ye, Lacey, WA (US)

(73) Assignee: Intel Corporation, Santa Clara, CA (US)

( * ) Notice: Subject to any disclaimer, the term of this patent is extended or adjusted under 35 U.S.C. 154(b) by 120 days.

(21) Appl. No.: 16/513,691

(22) Filed: Jul. 16, 2019

(65) Prior Publication Data
US 2019/0340146 A1 Nov. 7, 2019

(51) Int. Cl.
| | | |
|---|---|---|
| *G06F 13/40* | (2006.01) | |
| *G06F 1/3234* | (2019.01) | |
| *H04L 12/40* | (2006.01) | |
| *G06F 5/06* | (2006.01) | |
| *H03K 5/24* | (2006.01) | |

(52) U.S. Cl.
CPC ........ *G06F 13/4072* (2013.01); *G06F 1/3253* (2013.01); *G06F 5/06* (2013.01); *H03K 5/2481* (2013.01); *H04L 12/40* (2013.01)

(58) Field of Classification Search
CPC ...... G06F 13/4072; G06F 1/3253; G06F 5/06; H03K 5/2481; H04L 12/40

USPC ......................................................... 713/300
See application file for complete search history.

(56) References Cited

U.S. PATENT DOCUMENTS

| | | | | |
|---|---|---|---|---|
| 6,906,549 | B2* | 6/2005 | Schoenborn | H04L 25/45 326/21 |
| 7,986,159 | B1* | 7/2011 | Ahmad | G06F 3/0625 326/21 |
| 8,804,792 | B1* | 8/2014 | Cheung | H04L 25/03885 375/214 |
| 2004/0103333 | A1* | 5/2004 | Martwick | G06F 1/325 713/400 |
| 2004/0160852 | A1* | 8/2004 | Sasagawa | G11C 7/222 365/233.1 |
| 2008/0254842 | A1* | 10/2008 | Lin | H04W 52/0274 455/574 |
| 2012/0311359 | A1* | 12/2012 | Jaramillo | H04L 25/0298 713/321 |
| 2013/0007489 | A1* | 1/2013 | Unnikrishnan | G06F 1/3296 713/320 |

(Continued)

*Primary Examiner* — Paul R. Myers
(74) *Attorney, Agent, or Firm* — Alliance IP, LLC

(57) ABSTRACT

An apparatus, such as a re-driver, can include a receiver port coupled to a first link partner across a first link; a transmitter port coupled to a second link partner across a second link; and a power management (PM) controller implemented in hardware. The PM controller can detect a PM control signal, determine a PM state for the apparatus based on the PM control signal, and cause the apparatus to enter the PM state. The apparatus can transmit electrical signals to the second link partner based on the PM state. The PM management control signal can include a clock request, an electrical idle, a common mode voltage, or other electrical signal indicative of a PM link state change of a link partner coupled to the re-driver.

22 Claims, 14 Drawing Sheets

(56) References Cited

U.S. PATENT DOCUMENTS

| | | | |
|---|---|---|---|
| 2014/0173303 A1* | 6/2014 | Chen | G06F 13/4004 |
| | | | 713/310 |
| 2014/0176193 A1 | 6/2014 | De Vita et al. | |
| 2015/0227187 A1* | 8/2015 | Jeong | G06F 1/3203 |
| | | | 713/320 |
| 2016/0070502 A1* | 3/2016 | Matsumoto | G06F 3/0626 |
| | | | 711/103 |
| 2016/0149513 A1* | 5/2016 | Fujikawa | H02M 7/5387 |
| | | | 363/132 |
| 2018/0041110 A1* | 2/2018 | Liu | H02M 5/4585 |
| 2018/0335830 A1* | 11/2018 | Srivastava | G06F 1/3253 |
| 2019/0068397 A1* | 2/2019 | Chen | H04L 12/40 |
| 2020/0125527 A1* | 4/2020 | Maung | G06F 1/3209 |
| 2020/0228069 A1* | 7/2020 | Yin | H03G 3/348 |
| 2020/0409444 A1* | 12/2020 | Delshadpour | H04L 25/0286 |

* cited by examiner

POWER MANAGEMENT OF RE-DRIVER DEVICES

BACKGROUND

Interconnects can be used to provide communication between different devices within a system, some type of interconnect mechanism is used. One typical communication protocol for communications interconnects between devices in a computer system is a Peripheral Component Interconnect Express (PCI Express™ (PCIe™)) communication protocol. This communication protocol is one example of a load/store input/output (I/O) interconnect system. The communication between the devices is typically performed serially according to this protocol at very high speeds.

Devices can be connected across various numbers of data links, each data link including a plurality of data lanes. Upstream devices and downstream devices undergo link training upon initialization to optimize data transmissions across the various links and lanes

DETAILED DESCRIPTION

Figure 1:
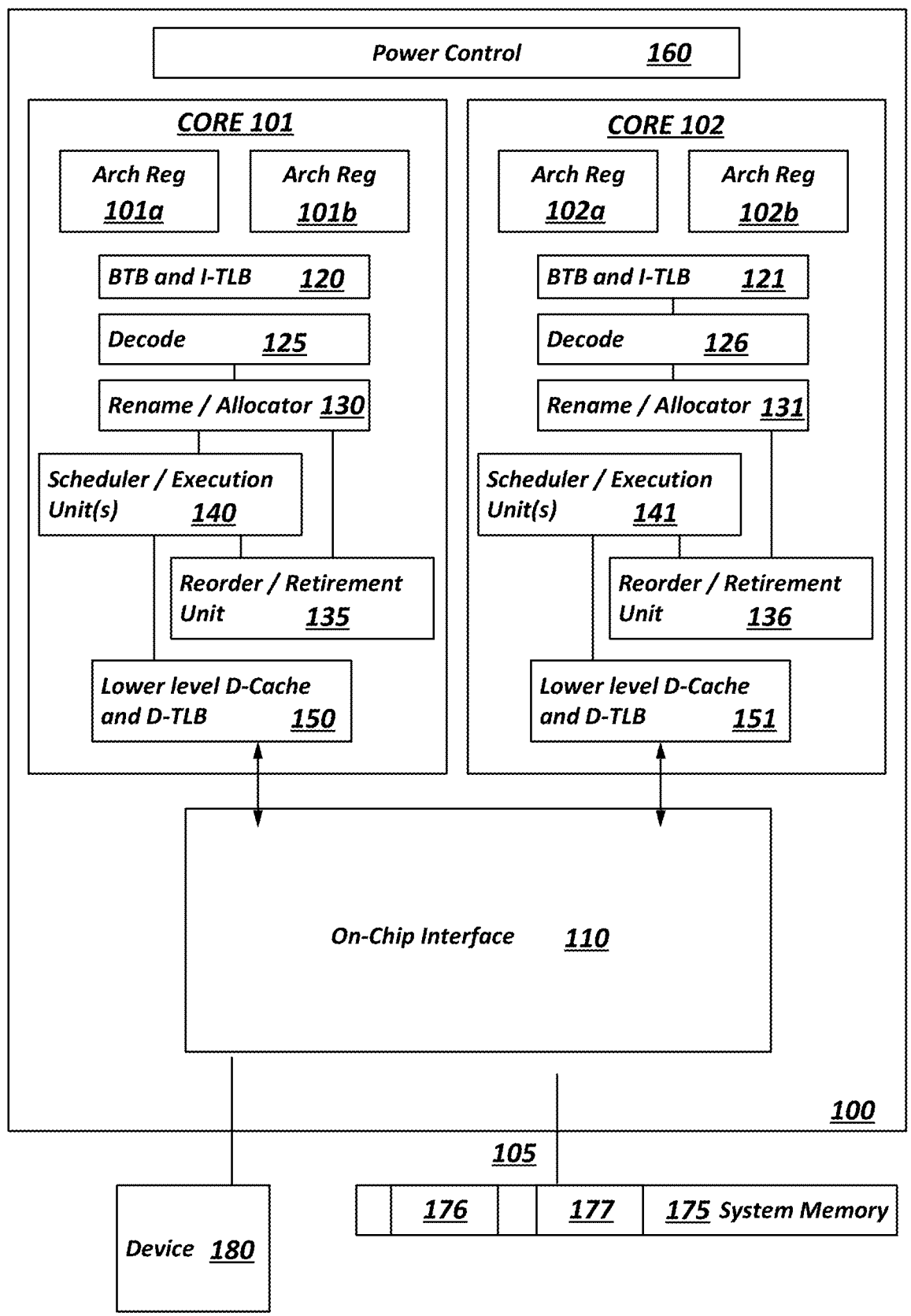
FIG. 1 illustrates an embodiment of a block diagram for a computing system including a multicore processor.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present disclosure.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the disclosure described herein.

Referring to FIG. 1, an embodiment of a block diagram for a computing system including a multicore processor is depicted. Processor 100 includes any processor or processing device, such as a microprocessor, an embedded processor, a digital signal processor (DSP), a network processor, a handheld processor, an application processor, a co-processor, a system on a chip (SOC), or other device to execute code. Processor 100, in one embodiment, includes at least two cores—core 101 and 102, which may include asymmetric cores or symmetric cores (the illustrated embodiment). However, processor 100 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 100, as illustrated in FIG. 1, includes two cores—core 101 and 102. Here, core 101 and 102 are considered symmetric cores, i.e. cores with the same configurations, functional units, and/or logic. In another embodiment, core 101 includes an out-of-order processor core, while core 102 includes an in-order processor core. However, cores 101 and 102 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 101 are described in further detail below, as the units in core 102 operate in a similar manner in the depicted embodiment.

As depicted, core 101 includes two hardware threads 101a and 101b, which may also be referred to as hardware thread slots 101a and 101b. Therefore, software entities, such as an operating system, in one embodiment potentially view processor 100 as four separate processors, i.e., four logical processors or processing elements capable of executing four software threads concurrently. As alluded to above, a first thread is associated with architecture state registers 101a, a second thread is associated with architecture state registers 101b, a third thread may be associated with architecture state registers 102a, and a fourth thread may be associated with architecture state registers 102b. Here, each of the architecture state registers (101a, 101b, 102a, and 102b) may be referred to as processing elements, thread slots, or thread units, as described above. As illustrated, architecture state registers 101a are replicated in architecture state registers 101b, so individual architecture states/contexts are capable of being stored for logical processor 101a and logical processor 101b. In core 101, other smaller resources, such as instruction pointers and renaming logic in allocator and renamer block 130 may also be replicated for threads 101a and 101b. Some resources, such as re-order buffers in reorder/retirement unit 135, ILTB 120, load/store buffers, and queues may be shared through partitioning. Other resources, such as general purpose internal registers, page-table base register(s), low-level data-cache and data-TLB 115, execution unit(s) 140, and portions of out-of-order unit 135 are potentially fully shared.

Processor 100 often includes other resources, which may be fully shared, shared through partitioning, or dedicated by/to processing elements. In FIG. 1, an embodiment of a purely exemplary processor with illustrative logical units/resources of a processor is illustrated. Note that a processor may include, or omit, any of these functional units, as well as include any other known functional units, logic, or firmware not depicted. As illustrated, core 101 includes a simplified, representative out-of-order (OOO) processor core. But an in-order processor may be utilized in different embodiments. The OOO core includes a branch target buffer 120 to predict branches to be executed/taken and an instruction-translation buffer (I-TLB) 120 to store address translation entries for instructions.

Core 101 further includes decode module 125 coupled to fetch unit 120 to decode fetched elements. Fetch logic, in one embodiment, includes individual sequencers associated with thread slots 101a, 101b, respectively. Usually core 101 is associated with a first ISA, which defines/specifies instructions executable on processor 100. Often machine code instructions that are part of the first ISA include a portion of the instruction (referred to as an opcode), which references/specifies an instruction or operation to be performed. Decode logic 125 includes circuitry that recognizes these instructions from their opcodes and passes the decoded instructions on in the pipeline for processing as defined by the first ISA. For example, as discussed in more detail below decoders 125, in one embodiment, include logic designed or adapted to recognize specific instructions, such as transactional instruction. As a result of the recognition by decoders 125, the architecture or core 101 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 126, in one embodiment, recognize the same ISA (or a subset thereof). Alternatively, in a heterogeneous core environment, decoders 126 recognize a second ISA (either a subset of the first ISA or a distinct ISA).

In one example, allocator and renamer block 130 includes an allocator to reserve resources, such as register files to store instruction processing results. However, threads 101a and 101b are potentially capable of out-of-order execution, where allocator and renamer block 130 also reserves other resources, such as reorder buffers to track instruction results. Unit 130 may also include a register renamer to rename program/instruction reference registers to other registers internal to processor 100. Reorder/retirement unit 135 includes components, such as the reorder buffers mentioned above, load buffers, and store buffers, to support out-of-order execution and later in-order retirement of instructions executed out-of-order.

Scheduler and execution unit(s) block 140, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 150 are coupled to execution unit(s) 140. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 101 and 102 share access to higher-level or further-out cache, such as a second level cache associated with on-chip interface 110. Note that higher-level or further-out refers to cache levels increasing or getting further way from the execution unit(s). In one embodiment, higher-level cache is a last-level data cache—last cache in the memory hierarchy on processor 100—such as a second or third level data cache. However, higher level cache is not so limited, as it may be associated with or includes an instruction cache. A trace cache—a type of instruction cache—instead may be coupled after decoder 125 to store recently decoded traces. Here, an instruction potentially refers to a macro-instruction (i.e. a general instruction recognized by the decoders), which may decode into a number of micro-instructions (micro-operations).

In the depicted configuration, processor 100 also includes on-chip interface module 110. Historically, a memory controller, which is described in more detail below, has been included in a computing system external to processor 100. In this scenario, on-chip interface 110 is to communicate with devices external to processor 100, such as system memory 175, a chipset (often including a memory controller hub to connect to memory 175 and an I/O controller hub to connect peripheral devices), a memory controller hub, a northbridge, or other integrated circuit. And in this scenario, bus 105 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 175 may be dedicated to processor 100 or shared with other devices in a system. Common examples of types of memory 175 include DRAM, SRAM, non-volatile memory (NV memory), and other known storage devices. Note that device 180 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 100. For example in one embodiment, a memory controller hub is on the same package and/or die with processor 100. Here, a portion of the core (an on-core portion) 110 includes one or more controller(s) for interfacing with other devices such as memory 175 or a graphics device 180. The configuration including an interconnect and controllers for interfacing with such devices is often referred to as an on-core (or un-core configuration). As an example, on-chip interface 110 includes a ring interconnect for on-chip communication and a high-speed serial point-to-point Link 105 for off-chip communication. Yet, in the SOC environment, even more devices, such as the network interface, co-processors, memory 175, graphics processor 180, and any other known computer devices/interface may be integrated on a single die or integrated circuit to provide small form factor with high functionality and low power consumption.

In one embodiment, processor 100 is capable of executing a compiler, optimization, and/or translator code 177 to compile, translate, and/or optimize application code 176 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

Figure 2A:
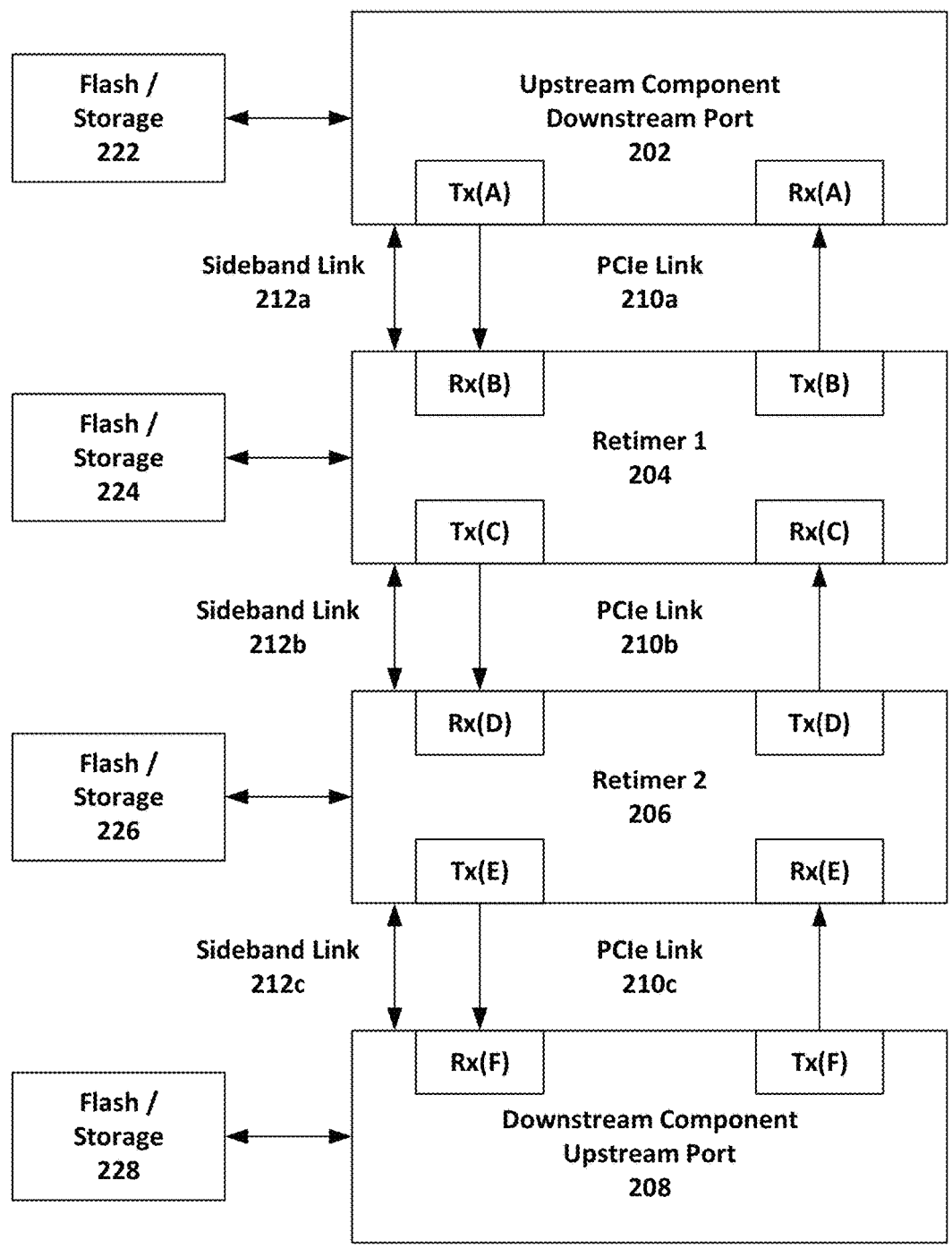
FIG. 2A is a schematic diagram of an interlinked system that includes two retimers in accordance with embodiments of the present disclosure.

FIG. 2A is a schematic and timing diagram illustrating a sample topology 200 with two re-timers 204 and 206 between an upstream component downstream port 202 and a downstream component upstream port 208 in accordance with embodiments of the present disclosure. The upstream component downstream port 202 can be a port for a PCIe-based device, such as a CPU or other device capable of generating a data packet and transmitting the data packet across a data Link compliant with the PCIe protocol. The downstream component upstream port 208 can be a port for a peripheral component that can receive a data packet from a Link compliant with the PCIe protocol. It is understood that the upstream component downstream port 202 and the downstream component upstream port 208 can transmit and receive data packets across PCIe Link(s), illustrated as PCIe Link 210a-c.

The topology 200 can include one or more retimers 204 and 206. Retimers 204 and 206 can serve as a signal repeater operating at the physical layer to fine tune the signal from the upstream component 202 and/or the downstream component upstream port 208. A retimer can use Continuous Time Linear Equalization (CTLE), Decision Feedback Equalization (DFE), and transmit an impulse response equalization (TX FIR EQ, or just TXEQ). Re-timers are transparent to the data Link and transaction layers but implement the full physical layer.

The multi-Lane PCIe Link is split into three Link segments (LS) 210a, 210b, and 210c in each direction. The upstream component downstream port 202 can be coupled to retimer1 204 by a multi-Lane PCIe Link 210a. The retimer 1 204 can be coupled to retimer 2 206 by link segment 210b. And retimer 2 206 can be coupled to downstream component upstream port 208 by link segment 210c.

Components can also be coupled by sideband linkages. The upstream component downstream port 202 can be coupled to retimer1 204 by a sideband link 212a. The retimer 1 204 can be coupled to retimer 2 206 by sideband link 212b. And retimer 2 206 can be coupled to downstream component upstream port 208 by sideband link 212c.

A function of a retimer (buffer) device is signal re-timing. These functions are performed by retimers 204 and 206. The particular retimer device circuits will depend on the PHY being used for the link. Generally, retimer circuitry is configured to recover the incoming signal and retransmit using a local clock and new transmit equalization circuitry, and may typically employ well-known circuitry for this purpose, such as phase lock loops. A retimer may further comprise transmitter and receiver circuitry including one or more amplifier circuits, as well as various types of well-known signal-conditioning circuitry used to increase the drive level of a received signal. Such retimer circuitry is well-known to those skilled in the high-speed interconnect arts, and, accordingly, no further details are shown or discussed herein.

Each retimer 204 and 206 can have an upstream path and a downstream path. In some implementations, a retimer can include two pseudo ports, and the pseudo ports can determine their respective downstream/upstream orientation dynamically. Further, retimers 204 and 206 can support operating modes including a forwarding mode and an executing mode. Retimers 204 and 206 in some instances can decode data received on the sub-link and re-encode the data that it is to forward downstream on its other sublink. As such, retimers may capture the received bit stream prior to regenerating and re-transmitting the bit stream to another device or even another retimer (or re-driver or repeater). In some cases, the retimer can modify some values in the data it receives, such as when processing and forwarding ordered set data. Additionally, a retimer can potentially support any width option as its maximum width, such as a set of width options defined by a specification such as PCIe.

As data rates of serial interconnects (e.g., PCIe, UPI, USB, etc.) increase, retimers are increasingly used to extend the channel reach. Multiple retimers can be cascaded for even longer channel reach. It is expected that as signal speeds increase, channel reach will typically decrease as a general matter. Accordingly, as interconnect technologies accelerate, the use of retimers may become more common. As an example, as PCIe Gen-4, with its 16 GT/s, is adopted in favor of PCIe Gen-3 (8 GT/s), the use of retimers in PCIe interconnects may increase, as may be the case in other interconnects as speeds increase.

In one implementation, a common BGA (Ball Grid Array) footprint may be defined for PCI Express Gen-4 (16 GT/s) based retimers. Such a design may address at least some of the example shortcomings found in conventional PCIe Gen-3 (8 GT/s) retimer devices, as well as some of the issues emerging with the adoption of PCIe Gen-4. Further, for PCIe Gen-4, the number of retimer vendors and volume are expected to increase. Due to signal losses from the doubled data rate (from 8 GT/s to 16 GT/s), the interconnect length achievable is significantly decreased in Gen-4. In this and other example interconnect technologies, as data rate increases, retimers may thereby have increased utility as they can be used to dramatically increase channel lengths that would be otherwise constrained by the increased data rate.

Although shown to be separate from the upstream component and downstream component, the retimer can be part of the upstream or downstream components, on board with the upstream or downstream components, or on package with the downstream component.

The upstream component downstream port 202 can have access to a storage element 222, such as a flash storage, cache, or other memory device. The retimer 1 204 can optionally include a similar storage element 224. The retimer 2 206 can optionally include a similar storage element 226. The downstream component upstream port 208 can optionally include a similar storage element 228.

Figure 2B:
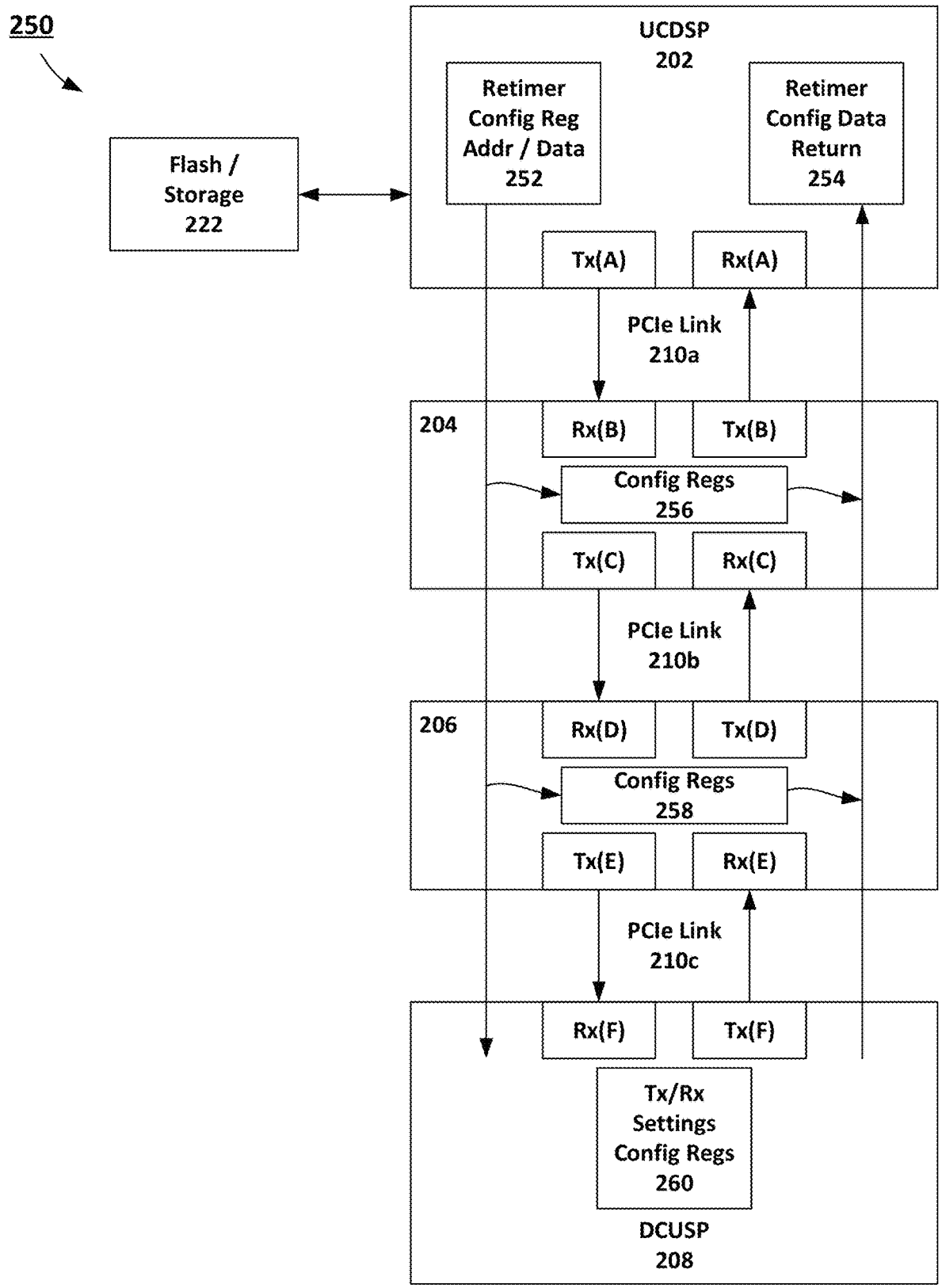
FIG. 2B is a schematic diagram of a connected system that illustrates in-band upstream port and retimer configuration in accordance with embodiments of the present disclosure.

FIG. 2B is a schematic diagram of a connected system 250 that illustrates in-band upstream port and retimer configuration in accordance with embodiments of the present disclosure. As shown in FIG. 2A, an upstream component downstream port 202 can be coupled to the downstream component upstream port 208 by a link 210a-c that is extended by two retimers 204, 206. In this example, the downstream port 202 can be provided with a retimer configuration register address/data register 252 to hold data to be sent in a configuration access command to one of the two retimers using fields of an enhanced SKP OS. One or more bits of the SKP OS can include a command code, data, or an address for use at a configuration register (e.g., 256, 258) of a retimer (e.g., 204, 206, respectively) to read or write data from/to the register 256, 258. Retimers can respond to configuration access commands sent by encoding data in an instance of an enhanced SKP OS by itself encoding response data in a subsequent instance of an enhanced SKP OS. Data encoded by the retimer (e.g., 204, 206) may be extracted at the downstream port and recorded in a retimer configuration data return register (e.g., 254). The registers (e.g., 252, 254) maintained at the upstream device downstream port 202 can be written to and read from by system software and/or other components of the system allowing (indirect) access to the retimer registers: one register (e.g., 252) conveying the address/data/command to the retimer and a second register (e.g., 254) that stores the responses coming back from the re-timer. In other implementations, such registers (e.g., 260) can be maintained at the downstream component upstream port 208 instead of or in addition to the registers being maintained at the upstream component downstream port 202, among other examples.

Continuing with the example of FIG. 2B, in connection with a mechanism for providing in-band access to retimer registers, the retimer may have architected registers that are addressable with well-defined bits and characteristics. In this example, an enhanced SKP OS is defined/modified as the physical layer-generated periodic pattern to carry the commands/information from "Retimer Config Reg Addr/Data" (e.g., 252) to the re-timers and carrying the responses from the re-timers back to load to "Retimer Config Data Return" (e.g., 840), with some bits allotted for CRC for the protection of data. For example, in PCIe this can include enhancing the existing SKP Ordered Set (e.g., with CSR Access and CSR Return (CRC-protected bits)). Further, a flow for ensuring guaranteed delivery of the commands/information to retimer and the corresponding response back can be defined. The physical layer mechanism can be enhanced to also include notifications from the re-timer (in addition to response) if it needs some sort of service, among other examples features.

Input/output (IO) bandwidth has significantly increased in recent years. For example, lane speeds for interconnects, such as those based on the PCIe interconnect protocols, has doubled every generation from 8 Gb/s (PCIe Gen3) to 16 Gbps (PCIE gen4) and 32 Gb/s (PCIe Gen5). USB lane speed leaped from 480 Mb/s (USB2.0) to 10 Gbps (USB3.2gen2) and 20 Gbps (USB4.0). As the IO speed increases for each generation, the PCB loss (dB) budget allocated to system board scales in a speed that is much slower than the bandwidth growth. This results in shorter and shorter channel reach. Repeater devices, such as re-drivers or retimers, can be used for channel extension.

Compared to retimer, a re-driver (such as re-driver 304) can include the advantages of: 1) lower cost; 2) relatively lower power consumption; 3) less delay; and 4) low complexity design with protocol agnostics. Despite exhibiting relatively low power consumption, re-drivers can consume significant amount of power, especially when used to support large number of I/O lanes. In addition, re-drivers tend to be protocol unaware or protocol/platform-agnostic. Typically, a re-driver consumes ~150-300 mW/lane at the active state and more than several mW/lane during standby. On datacenter platforms, the total number of high speed IO lanes can exceed a few hundred, including PCIe, UPI, USB, etc.

This disclosure describes re-driver power management mechanisms that not only reduces the platform power consumption, but also can impact thermal design. The power management mechanisms described herein can achieve the same or similar power management capabilities of a protocol-aware retimer. The power management mechanisms described herein can improve the power consumption for re-driver applications, and can be applied to re-drivers for different interfaces, such as PCIe, USB, UPI, etc. (PCIe is used herein to provide context).

Figure 3A:
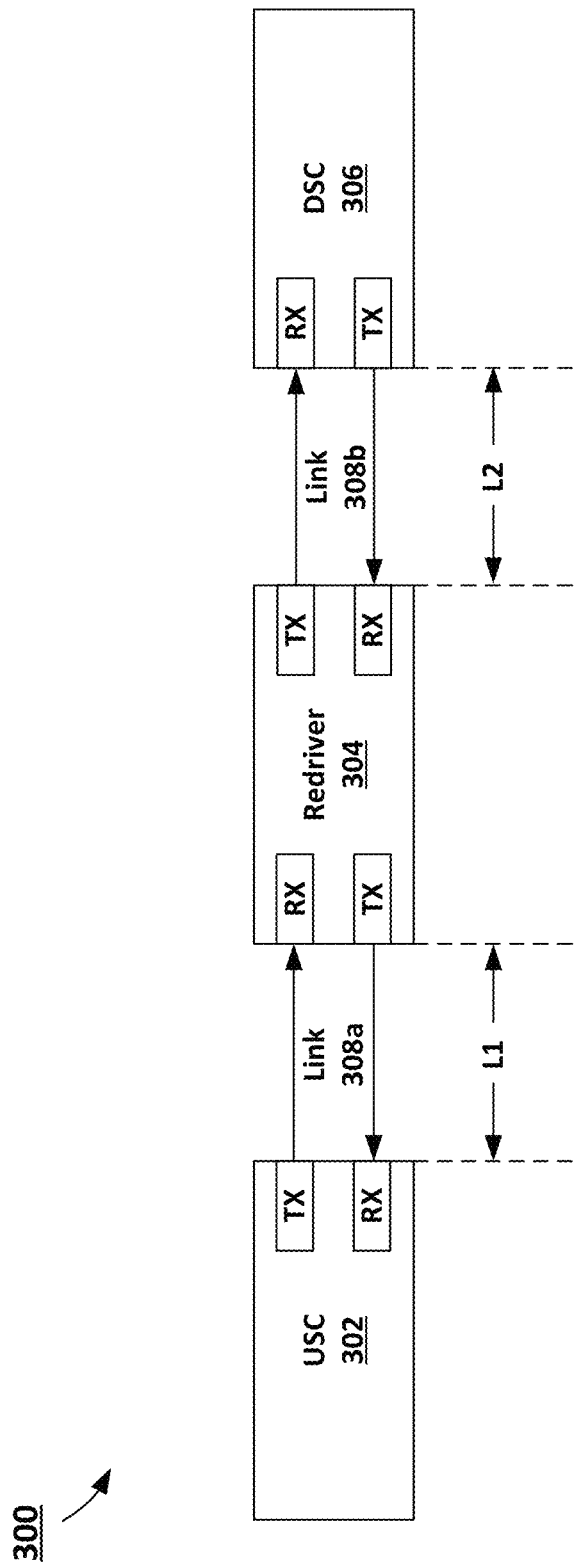
FIG. 3A is a schematic logical diagram of a transmission pathway that includes a re-driver in accordance with embodiments of the present disclosure.

FIG. 3A is a schematic logical diagram of a transmission topology 300 that includes a re-driver in accordance with embodiments of the present disclosure. Topology 300 can include an upstream component (USC) 302, which can be implemented in hardware, software, or a combination or hardware or software. USC 302 can be implemented using analog and/or digital circuitry. USC 302 can support the transmission (TX) and reception (RX) of electrical signals across a link. For example UPC 302 can transmit and receive electrical signal to downstream component (DSC) 306. DSC 306 can be implemented in hardware, software, or a combination or hardware or software. DSC 306 can be implemented using analog and/or digital circuitry. DSC 306 can support the transmission (TX) and reception (RX) of electrical signals across a link.

The UPC 302 can transmit and/or receive electrical signals across a link 308a and DSC 306 can transmit and receive electrical signals across a link 308b. The effective channel length of the topology 300 can be L1+L2, which are the effective lengths of the links 308a and 308b. A re-driver 304 can provide channel extension for the topology 300. Table 1 illustrates example channel extension with and without a re-driver for various conditions, such as PCIe speeds, PCB materials, etc.

TABLE 1

Example estimated total channel length with and without a re-driver.

| Speed/Material | Without Re-Driver | | With Re-Driver | |
|---|---|---|---|---|
| | Low Loss PCB Material | Ultra-low Loss PCB Material | Low Loss PCB Material | Ultra-low Loss PCB Material |
| PCIe 3.0 (8GT/s) | ~20-22 in | ~30 in | ~35 in | >45 in |
| PCIe 4.0 (16GT/s) | ~14 in | ~21 in | ~25 in | ~32 in |
| PCIe 5.0 (32GT/s) | ~8 in | ~12 in | ~13 in | ~20 in |

Figure 3B:
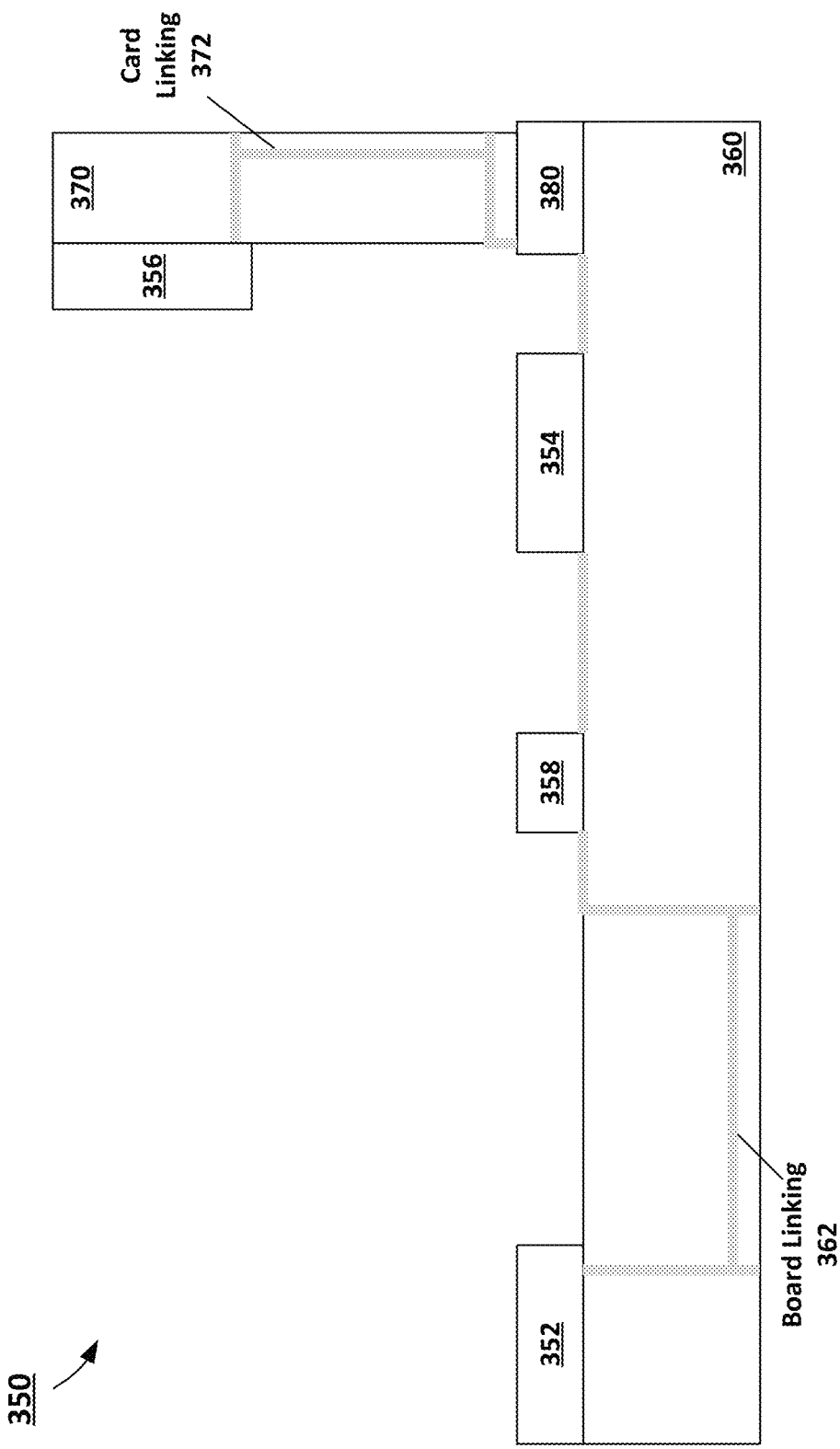
FIG. 3B is a schematic block diagram of an example board implementation for a re-driver in accordance with embodiments of the present disclosure.

FIG. 3B is a schematic block diagram of an example board implementation for a re-driver in accordance with embodiments of the present disclosure. A system 350 can include a base board 360. Base board 360 can include a printed circuit board (PCB) or other substrate that can support electrical components. Such electrical components can include upstream component 352, re-driver 354, circuit elements (such as capacitor 358), connector 380, signal routing (such as board linking 362). USC 352 can be similar to USC 302 of FIG. 3A above. Re-driver 354 can be similar to re-driver 304 above.

Re-driver 354 can include an analog (or combination analog and digital) reach extension device designed to boost the high-frequency portions of a signal to counteract the frequency-dependent attenuation caused by the interconnect media, including various components of the interconnect components, such as the central processing unit (CPU) package, system board, connectors, transmission lines, etc. Re-driver 354 can include a data path typically having a continuous time linear equalizer (CTLE), a wideband gain stage and a linear driver. To facilitate upstream and downstream transmission and reception, the re-driver 354 can include a transmitter element and a receiver element. The re-driver can be unidirectional or bidirectional. In addition, re-drivers can include a squelch detector at the receiver to detect the loss of signal or start of the incoming signal.

Base board 360 can support a connector 380 that can electrically and physically couple an add-in card (AIC) 370 to base board 360. The AIC 370 can support electrical components, such as a downstream component (DSC) 356, which can be similar to DSC 306 above. The DSC 356 can be electrically coupled to USC 352 via card linking 372, through the connector 380 and through board linking 362. In embodiments, re-driver 354 can reside between, and be electrically coupled to, the USC 352 and DSC 356. In the embodiment of system 350 shown in FIG. 3B, re-driver 354 resides on the base board 360. In other embodiments, a re-driver can reside on the AIC 370.

Re-driver devices can be analog devices and can be protocol unaware. Therefore, such re-drivers do not benefit from power management schemes provided by interconnect protocols or other mechanisms, which can be due to the re-driver's inability to interpret link power management commands. Re-drivers, thus, are maintained in a standby mode when there is no link traffic or would receive a control signal (usually through a power gate) to set the device into a low power mode or completely shut down the device power. The lack of standard compliant re-driver power management state associating with link power states have complicated the system design and is not power efficient.

Lacking a power management scheme in those devices has two disadvantages: 1) The device can consume more power than required; 2) completely wake up from a power-down state takes longer time and may impact the latency.

The power management scheme for re-driver devices described herein allows re-drivers to manage (or self-manage) the power consumption. This power management scheme is achieved by determining or inferring a protocol link state and setting the re-driver to a corresponding power state. Therefore, the re-driver power management techniques described herein can save the platform power without sacrificing latency requirements. PCIe re-drivers are used herein as an example. In some embodiments, three signals can be used to infer the PCIe link state. The power management techniques can apply to re-drivers for other interfaces with similar implementation, such as USB.

The advantages of the present embodiments are apparent to those of skill in the art. Among the various advantages include a re-driver capable of performing based on the link power management states without decoding the link power management commands, which significantly reducing the implementation complexity. Another example advantage can include conserving the power consumption of re-driver devices without sacrificing link latency.

The re-driver power management scheme described herein involves mapping re-driver power states to existing link states defined in the PCIe protocol (PCIe is, again, used here as an example, and other interconnect protocol power management states can also be mapped in a similar fashion). An example PCIe re-driver power management scheme is illustrated by the mapping shown in Table 2.

The first column of Table 2 shows the PCIe link states. The PCIe standard defines several link states from L0 to L3, including one or more sub-states. As the link state transitions from L0 through L3, the power saving increases. The link states can be described as follows: fully active state (L0), electrical idle or standby state (L0s), L1 (lower power standby/slumber state), L2 (low power sleep state), and L3 (link Off state). As links transition from L0 to L3 states, power saving and exit latencies increase. In the L0 state, the link is fully active in its ready mode. During short intervals of logical idle in absence of link activities, the link may transition into an L0s state with very low exit latencies (several hundred nanoseconds) for a small power reduction. In the L1 state, supplies and reference clock components are fully active except as permitted by the clock power management (using CLKREQ#) when enabled. When the optional internal PLL is off or on, TX and RX may be off or idle, and the common mode keeper remains active. Depending on the number of optional active devices in L1 state, power savings in the L1 standby mode can be limited and does not meet the requirements of mobile market as intended, even though the exit latencies of L1 state could be in the order of microseconds under certain conditions.

In the L2 sleep state, clocks and main power supplies are turned off, providing the highest idle state power savings. However, exit latencies can be relatively long: in the order of tens of milliseconds; therefore, the L2 power state is commonly used in mobile applications when the system enters prolonged standby state.

When the link wakes up (i.e., the link transitions to L0) from a power saving mode, the latency increases. To reduce power consumption in the L1 idle state with reasonable exit latency targets and without impacting the overall performance of the PCIe link states, two sub-states are defined as part of the L1 link state. L1 sub-states L1.1 and L1.2 utilize a per-link bi-directional sideband clock request signal, CLKREQ# that is required by both ports on the two ends of a link. If both ends of the link are not L1 sub-state capable and enabled, then the link may only operate in the legacy L1 power state. Internal phase locked loops (PLLs) no longer have an option to be on and should be turned off in both L1.1 and L1.2, as reference clock inputs are not required in L1 sub-states. Similarly, both the TX and RX are turned off and are not required to detect electrical idle in these sub-states. The main difference between L1.1 and L1.2 is the common mode voltage status, as it is maintained in the L1.1 and is

TABLE 2

PCIe link states mapped to re-driver power modes and power mode control signals.

| PCIe Link State | Re-Driver State Machine | Re-driver Power state/ Operation | Power Mode Control Signal | | |
|---|---|---|---|---|---|
| | | | EI Det | CLKREQ# | Vtx_cm Det |
| L0 | Rdr-L0 | Active forwarding | No | Asserted | N/A |
| L0s L1.0 (short latency) | Rdr-L0s | Stand-by for RX squelch detect enabled | Yes | Asserted | Maintained |
| L1.0 (long latency) L1.1 | Rdr-L1 | TX/RX in low pwr state; TX maintains Vtx_cm | Yes | De-asserted | Maintained |
| L1.2 L2 | Rdr-L2 | TX/RX in low pwr state; TX does not maintain Vtx_cm | Yes | De-asserted | Not Maintained |
| L3 | Power off | Device power off | N/A | N/A | N/A | turned off in L1.2 sub-state. Therefore, because of the common mode restoration time, exit latency of L1.2 is longer than L1.1.

The mapped re-driver power mode and operation conditions are defined in second and third columns of Table 2, respectively. In this example, three control signals are used to infer the PCIe link state and control the transitions between different re-driver power modes. These signals and their status at each power mode are defined in the last three columns of Table 2, including Electrical Idle (EI) detection, clock request (CLKREQ#), and detection of the transmitter common mode voltage (Vtx_cm) of a link partner.

Figure 4:
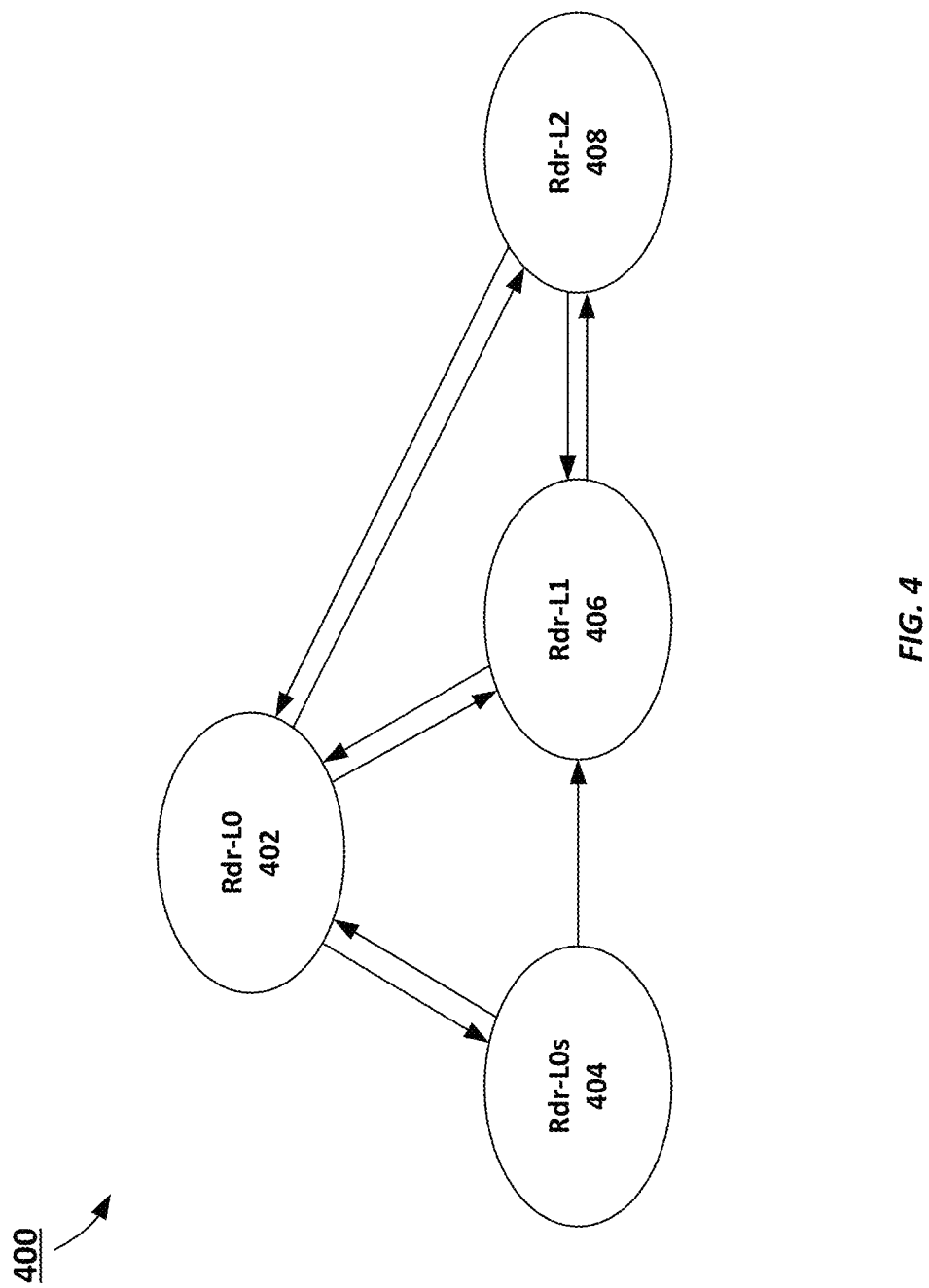
FIG. 4 is a schematic diagram illustrating an example topology that includes more than one re-driver in accordance with embodiments of the present disclosure.

FIG. 4 is a schematic diagram of a state machine 400 for re-driver power mode transitions in accordance with embodiments of the present disclosure. The transition between different re-driver power modes is shown in FIG. 4. The re-driver state machine 400 includes four power management states (the power off state is not shown, but would map similarly to the L3 PCIe link state). Considering Table 2 and FIG. 4 together:

Re-driver (Rdr) L0 state 402 can map to the L0 PCIe state. The re-driver power state/operation can include active forwarding of signals during Rdr-L0. Rdr-L0 state 402 is the re-driver active state corresponding to PCIe L0 state. When in Rdr-L0 state 402, the link is active and the re-driver forwards the data traffic from a transmitting device to a receiving device. Rdr-L0 state 402 is entered when electrical idle (EI) detection is "No" and CLKREQ# is asserted, and without consideration of the Vtx_cm.

The Rdr-L0s state 404 can map to the L0s and L1.0 (short latency) PCIe link states. Rdr-L0s state 404 is a re-driver standby mode corresponding to the PCIe L0s and L1.0 (short latency) states. When in the Rdr-L0s state 404, the re-driver stands by for the link traffic with RX squelch detection activated. Rdr-L0s 404 is entered when electrical idle EI is asserted/detected but CLKREQ# is still asserted. When in Rdr-L0s state 404, the re-driver can quickly wakeup and transition back to active (Rdr-L0) mode with low latency (e.g., in a similar fashion as the PCIe L1.0 low latency PM state).

The Rdr-L1 state 406 can map to the L1.0 (long latency) and L1.1 PCIe link states. The Rdr-L1 state 406 is the re-driver low power mode corresponding to the PCIe L1.0 (long latency) and L1.1 states. When in The Rdr-L1 state 406, the re-driver TX/RX are in low power mode. The re-driver TX maintains the common mode voltage (Vtx_cm). The Rdr-L1 state 406 is entered from the Rdr-L0s state 404 upon detecting the de-assertion of CLKREQ#, or entered from the Rdr-L0 402 state upon substantially simultaneous detection of electrical idle (EI) and CLKREQ# de-assertion.

The Rdr-L2 state 408 can map to the L1.2 and L2 PCIe link states. The Rdr-L2 state 408 is the re-driver lowest power mode and corresponds to the PCIe L1.2 to L2 states. When in the Rdr-L2 state 408, the redriver TX/RX are in low power mode. The Rdr-L2 state 408 is entered from the Rdr-L1 state 406 upon detecting the removal of the common mode voltage (Vtx_cm), or from the Rdr-L0 state 402, upon substantially simultaneous detection of the electrical idle (EI) at input, the de-assertion of CLKREQ#, and the removal of the common mode voltage (Vtx_cm). In other implementations, the re-driver may implement a substate in Rdr-L2 state 408, if the optional in-band wake is supported.

In this example, three control signals are used to infer the PCIe link state and control the transitions between different re-driver power modes. These signals and their status at each power mode are defined in the last three columns of Table 2, including "electrical Idle" detection, clock request (CLKREQ#), and detection of the transmitter common mode voltage (Vtx_cm) of a link partner.

Figure 5A:
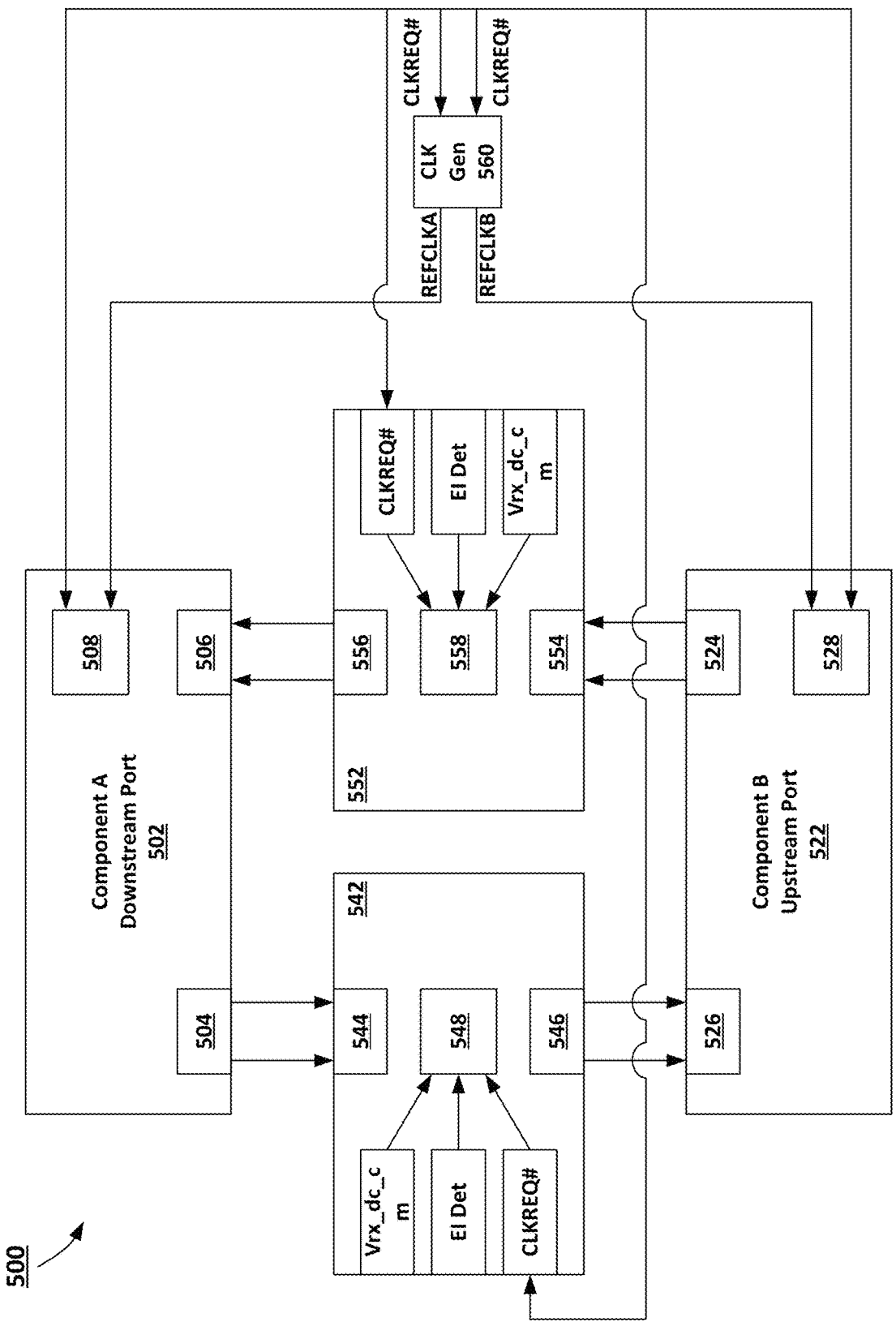
FIG. 5A is a schematic diagram illustrating an example topology that includes more than one re-driver in accordance with embodiments of the present disclosure.

FIG. 5A is a schematic diagram illustrating an example topology 500 that includes more than one re-driver in accordance with embodiments of the present disclosure. Topology 500 is an example simplified circuit implementation of the three control signals (EI det, Vtx_cm, and CLKREF#).

Topology 500 can include a first component, Component A downstream port (CA_DSP) 502. CA_DSP 502 includes a transmitter 504 and a receiver 506. The CA_DSP 502 can also include a phased locked loop (PLL) 508, as well as other circuit components. Topology 500 can also include a second component, Component B upstream port (CB_USP) 522. CB_USP 522 includes a receiver 526, a transmitter 524, and a PLL 528, as well as other circuit elements.

A first re-driver 542 can reside within a circuit pathway between the transmitter 504 and receiver 526. The re-driver 542 can include a re-driver receiver 544 and a re-driver transmitter 546. The re-driver 542 can also include a power management (PM) controller 548. The re-driver 542 can also include inputs for the three PM control signals: a CLKREQ# input, which can be a sideband input from the clock generator (CLK Gen) 560; EI detection input, and common mode voltage input.

A second re-driver 552 can reside within a circuit pathway between the transmitter 524 and receiver 506. The re-driver 552 can include a re-driver receiver 5454 and a re-driver transmitter 556. The re-driver 552 can also include a power management (PM) controller 558. The re-driver 552 can also include inputs for the three PM control signals: the CLKREQ# input, which can be a sideband input from the clock generator (CLK Gen) 560; EI detection, and common mode voltage.

In this example, the CLK Gen 560 generates reference clocks for both CA_DSP 502 (REFCLKA) and CB_USP 522 (REFCLKB). The clock request signals (CLKREQA# & CKLREQB#) are coupled together and fed into the two unidirectional re-drivers 542 and 552. This way, the CLKREQ# signal is tapped into without affecting clock signal functionalities. In embodiments, tapping into the CLKREQ# can be similar in functionality and form as using a side-band input from the CLK Gen 560 into the CLKREQ# inputs of each re-driver 542 and 552.

Figure 5B:
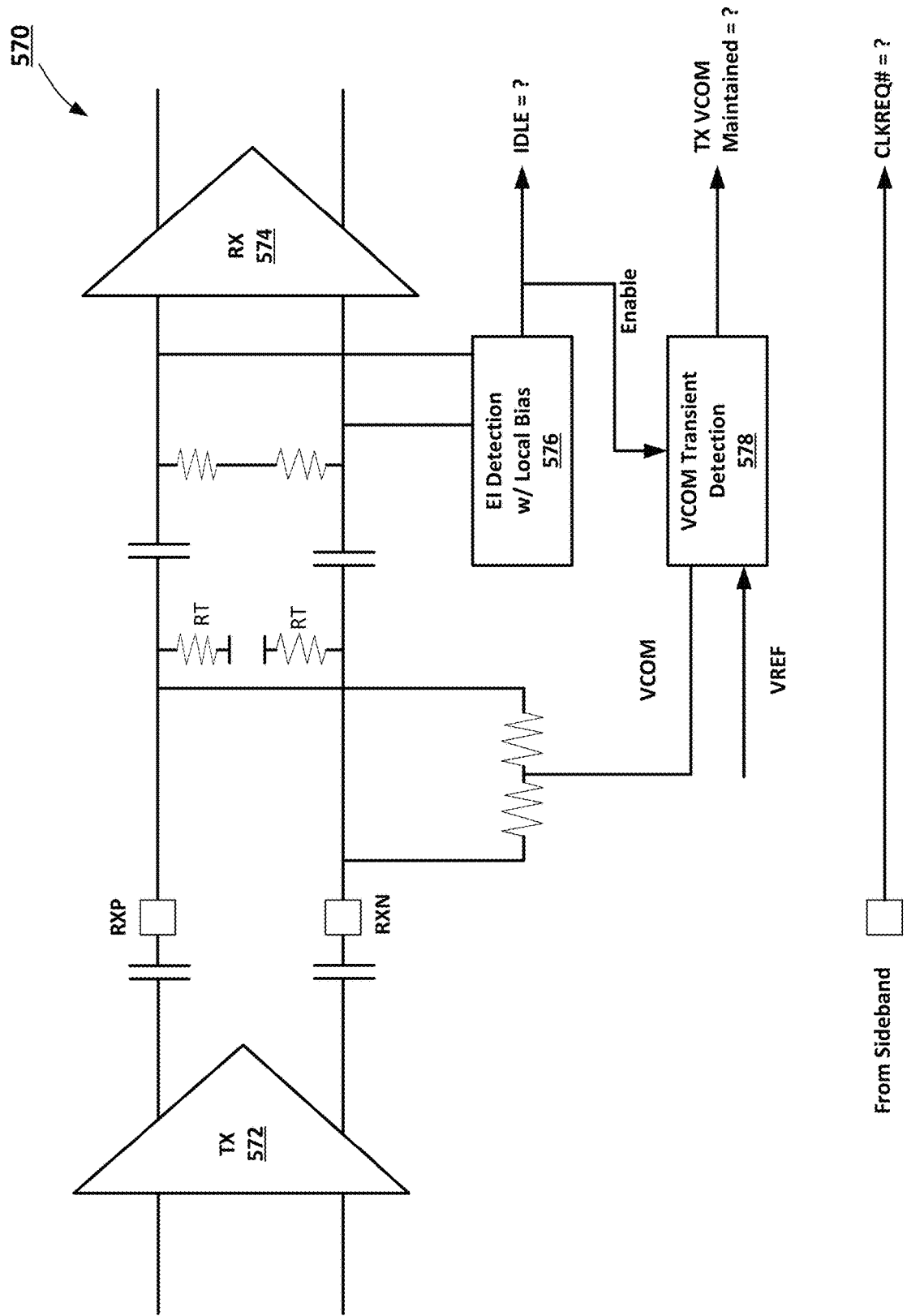
FIG. 5B is a schematic diagram of example logic for detecting Electrical Idle and common mode voltage in accordance with embodiments of the present disclosure.

FIG. 5B is a schematic diagram of example logic 570 for detecting Electrical Idle and common mode voltage in accordance with embodiments of the present disclosure. The example logic 570 can be implemented in hardware, software, or a combination of hardware and software. In FIG. 5B, example logic is shown for the Electrical Idle detection (EI Det) and the TX common mode voltage detection (Vtx_cm Det). FIG. 5B illustrates an example TX circuit 572 and RX circuit 574. EI detection logic 576, which can be implemented as hardware, software, or a combination of hardware and software, can detect EI. The "electrical idle" can be detected by circuit elements to compare RX 574 differential peak-to-peak voltage (Vrx_diff_pp) with a predefined threshold (Vrx_idle_det_diff_pp; local bias voltage). The output of the EI Det logic 576 can indicate the presence of absence of the EI for controlling the PM states of the re-driver.

The common mode voltage detection logic 578 can be implemented in hardware, software, or a combination of hardware and software. Vtx_cm is the TX 572 common mode voltage of a link partner. The Vtx_cm Det logic 578 includes circuit elements to monitor the TX 572 common mode voltages.

The EI detector can include a squelch detector at the receiver to detect the loss of signal or start of the incoming signal. A squelch detector can be used for detecting activity or signal loss on a signal line and to determine whether that activity on the signal line qualifies as a signal for processing or as noise.

The "clock request" (CLKREQ#) can be a sideband signal that can be tapped by the re-driver. The CLKREQ# is asserted when reference clock is available and de-asserted otherwise.

The above disclosure provides power mode control and implementations for PCIe-based re-drivers. Other protocol implementations for re-driver power management control are also contemplated. Table 3 illustrates USB 3.2 link states mapped to re-driver power modes and operations, with control signals for each power management state.

TABLE 3

USB 3.2 link states mapped to re-driver power modes and power mode control signals.

| USB3.2 Link State | Re-Driver State Machine | Re-driver Power state/ Operation | Power mode control signals | |
|---|---|---|---|---|
| | | | EI Det | Vtx_cm Det |
| U0 | Rdr-U0 | Active forwarding | No | N/A |
| U1 | Rdr-U1 | Stand by for RX squelch detect enabled | Yes | Maintained |
| U2/U3 | Rdr-Ux | TX/RX in low pwr state; TX only maintains Vtx_dc_cm | Yes | Not maintained |

Table 3 shows the power mode control for USB 3.2-based re-drivers. The first column in Table 3 shows the existing USB 3.2 link states. The mapped re-driver power mode and operation condition are in the second and third columns. The power mode control signals are listed in the last portion. The mechanism is similar to PCIe re-drivers, except that USB 3.2 re-driver has fewer power states and does not need CLKREQ# signal. The two control signals "Electrical Idle Detect" and "Vtx_cm Detect" are generated internally inside re-driver device with similar implementations as shown above for the PCIe implementation.

Figure 6:
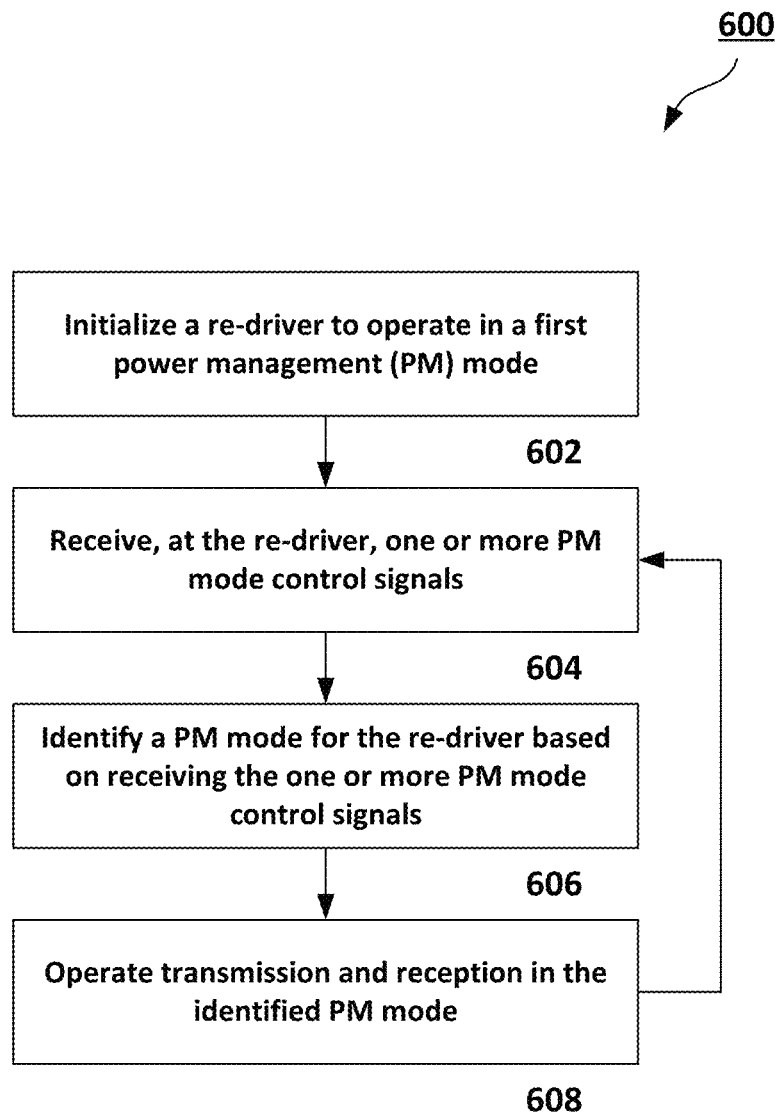
FIG. 6 is a process flow diagram for changing re-driver power management states in accordance with embodiments of the present disclosure.

FIG. 6 is a process flow diagram 600 for changing re-driver power management states in accordance with embodiments of the present disclosure. An re-driver, which can include a power management (PM) controller, can be initialized and can operate in a first PM mode (602). For example, upon initialization, the re-driver can operate in the same PM mode as the upstream component or downstream component link partners. For example, the re-driver can initialize in an active state that corresponds to a PCIe L0 link state when the link partners are also initialized to operating the L0 link state.

As the one or more link partners change PM link states, the re-driver PM controller can receive or detect one or more electrical signals indicative of the change of the PM link state (604). The electrical signals can include a clock request (CLKREQ#), an electrical idle (EI), a common mode voltage (Vtx_cm), or other electrical signal that can identify a PM link state change.

The PM controller can determine a PM mode for the re-driver based on the electrical signals received or detected (606). The re-driver can then operate in the PM mode determined based on the received electrical signals (608). The re-driver can then continue to detect electrical signals to change the PM mode as the PM link states change.

One interconnect fabric architecture includes the Peripheral Component Interconnect (PCI) Express (PCIe) architecture. A goal of PCIe is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express.

Figure 7:
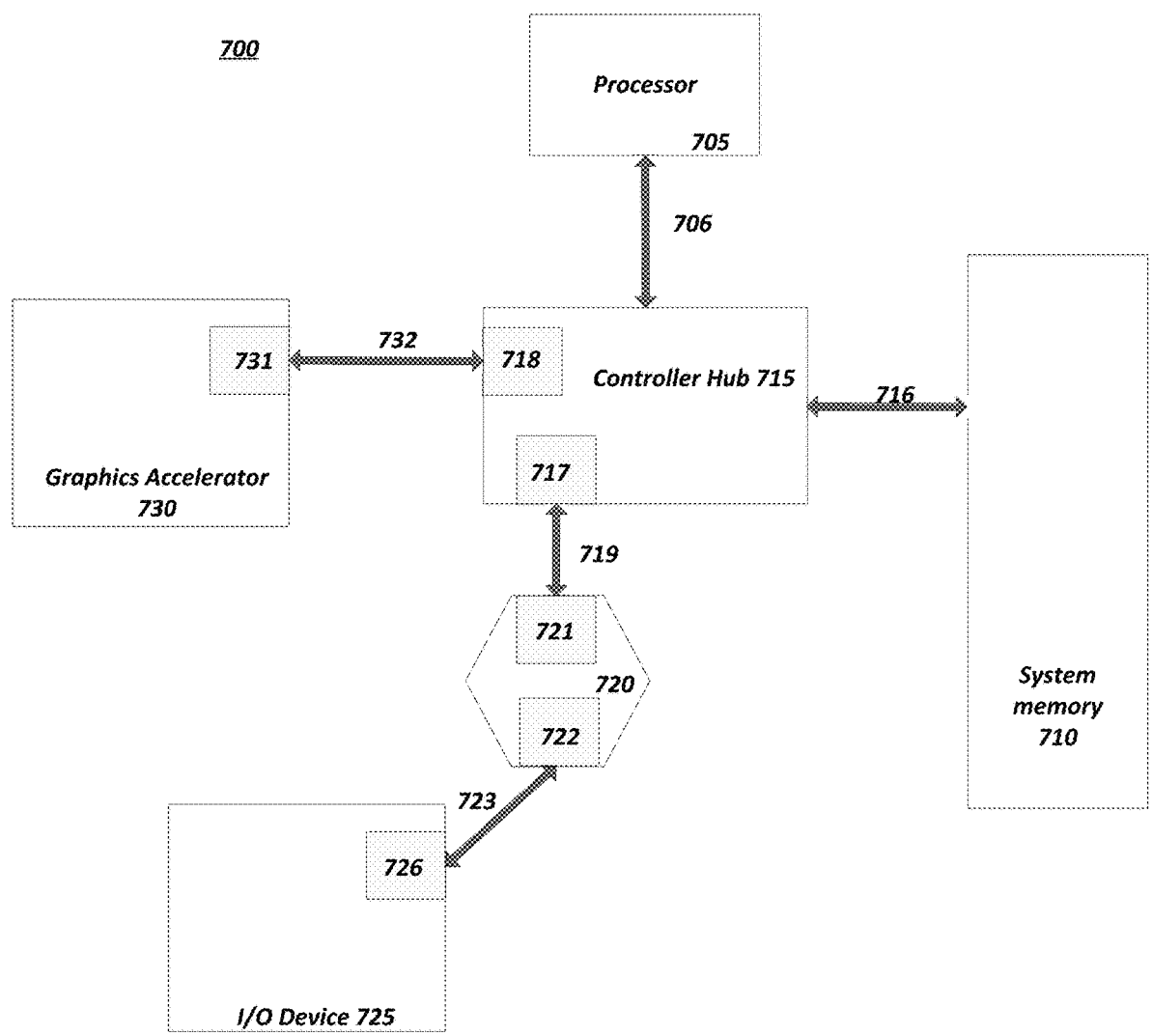
FIG. 7 illustrates an embodiment of a computing system including an interconnect architecture.

Referring to FIG. 7, an embodiment of a fabric composed of point-to-point Links that interconnect a set of components is illustrated. System 700 includes processor 705 and system memory 710 coupled to controller hub 715. Processor 705 includes any processing element, such as a microprocessor, a host processor, an embedded processor, a co-processor, or other processor. Processor 705 is coupled to controller hub 715 through front-side bus (FSB) 706. In one embodiment, FSB 706 is a serial point-to-point interconnect as described below. In another embodiment, link 706 includes a serial, differential interconnect architecture that is compliant with different interconnect standard.

System memory 710 includes any memory device, such as random access memory (RAM), non-volatile (NV) memory, or other memory accessible by devices in system 700. System memory 710 is coupled to controller hub 715 through memory interface 716. Examples of a memory interface include a double-data rate (DDR) memory interface, a dual-channel DDR memory interface, and a dynamic RAM (DRAM) memory interface.

In one embodiment, controller hub 715 is a root hub, root complex, or root controller in a Peripheral Component Interconnect Express (PCIe or PCIE) interconnection hierarchy. Examples of controller hub 715 include a chipset, a memory controller hub (MCH), a northbridge, an interconnect controller hub (ICH) a southbridge, and a root port controller/hub. Often the term chipset refers to two physically separate controller hubs, i.e. a memory controller hub (MCH) coupled to an interconnect controller hub (ICH). Note that current systems often include the MCH integrated with processor 705, while controller 715 is to communicate with I/O devices, in a similar manner as described below. In some embodiments, peer-to-peer routing is optionally supported through root complex 715.

Here, controller hub 715 is coupled to switch/bridge 720 through serial link 719. Input/output modules 717 and 721, which may also be referred to as interfaces/ports 717 and 721, include/implement a layered protocol stack to provide communication between controller hub 715 and switch 720. In one embodiment, multiple devices are capable of being coupled to switch 720.

Switch/bridge 720 routes packets/messages from device 725 upstream, i.e. up a hierarchy towards a root complex, to controller hub 715 and downstream, i.e. down a hierarchy away from a root port controller, from processor 705 or system memory 710 to device 725. Switch 720, in one embodiment, is referred to as a logical assembly of multiple virtual PCI-to-PCI bridge devices. Device 725 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 725 may include a PCIe to PCI/PCI-X bridge to support legacy or other version PCI devices. Endpoint devices in PCIe are often classified as legacy, PCIe, or root complex integrated endpoints.

Graphics accelerator 730 is also coupled to controller hub 715 through serial link 732. In one embodiment, graphics accelerator 730 is coupled to an MCH, which is coupled to an ICH. Switch 720, and accordingly I/O device 725, is then coupled to the ICH. I/O modules 731 and 718 are also to implement a layered protocol stack to communicate between graphics accelerator 730 and controller hub 715. Similar to the MCH discussion above, a graphics controller or the graphics accelerator 730 itself may be integrated in processor 705.

Figure 8:
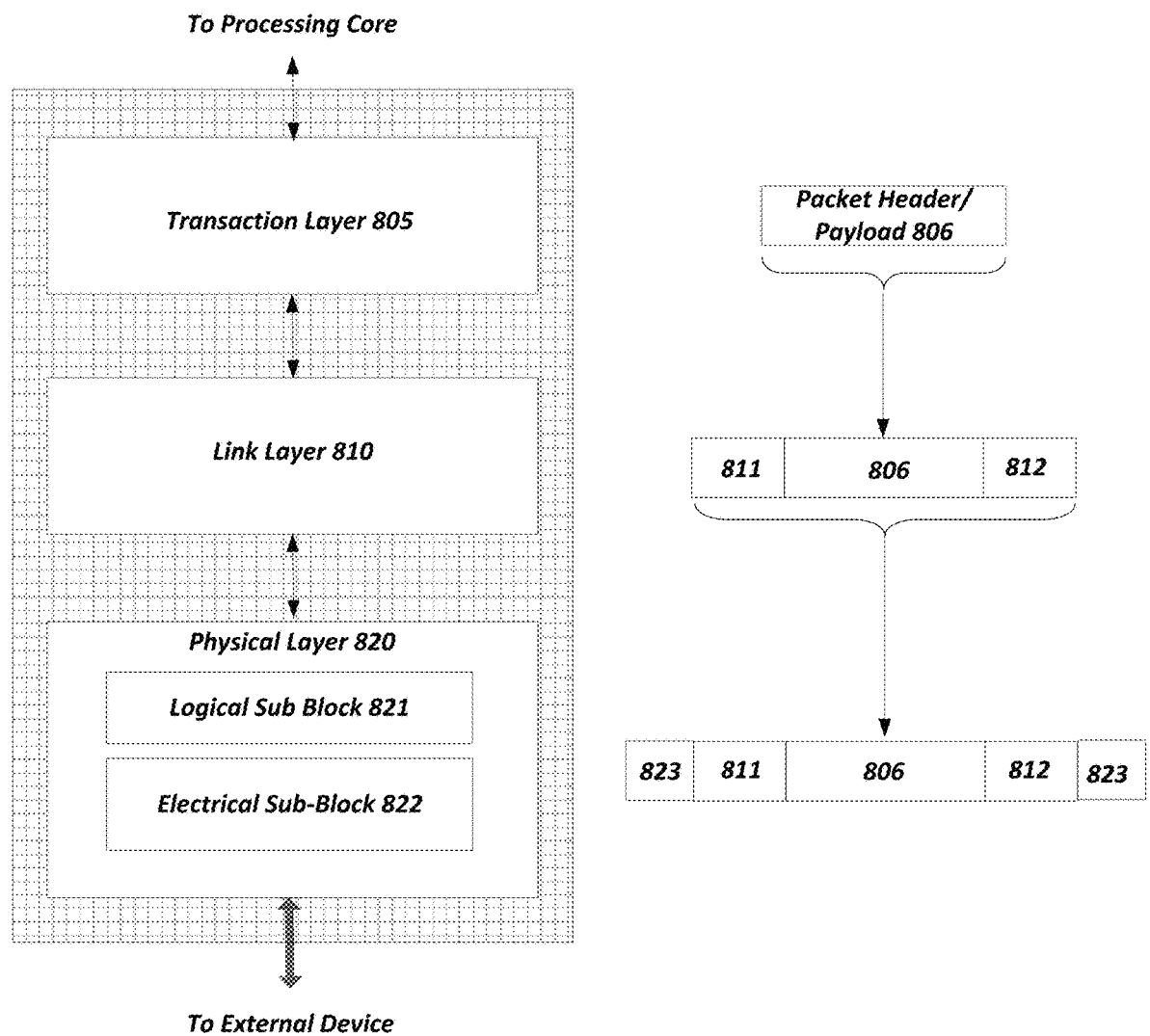
FIG. 8 illustrates an embodiment of an interconnect architecture including a layered stack.

Turning to FIG. 8 an embodiment of a layered protocol stack is illustrated. Layered protocol stack 700 includes any form of a layered communication stack, such as a Quick Path Interconnect (QPI) stack, a PCIe stack, a next generation high performance computing interconnect stack, or other layered stack. Although the discussion immediately below in reference to FIGS. 7-10 are in relation to a PCIe stack, the same concepts may be applied to other interconnect stacks. In one embodiment, protocol stack 800 is a PCIe protocol stack including transaction layer 805, link layer 810, and physical layer 820. An interface, such as interfaces 717, 718, 721, 722, 726, and 731 in FIG. 7, may be represented as communication protocol stack 800. Representation as a communication protocol stack may also be referred to as a module or interface implementing/including a protocol stack.

PCI Express uses packets to communicate information between components. Packets are formed in the Transaction Layer 805 and Data Link Layer 810 to carry the information from the transmitting component to the receiving component. As the transmitted packets flow through the other layers, they are extended with additional information necessary to handle packets at those layers. At the receiving side the reverse process occurs and packets get transformed from their Physical Layer 820 representation to the Data Link Layer 810 representation and finally (for Transaction Layer Packets) to the form that can be processed by the Transaction Layer 705 of the receiving device.

Transaction Layer

In one embodiment, transaction layer 805 is to provide an interface between a device's processing core and the interconnect architecture, such as data link layer 810 and physical layer 820. In this regard, a primary responsibility of the transaction layer 805 is the assembly and disassembly of packets (i.e., transaction layer packets, or TLPs). The translation layer 805 typically manages credit-base flow control for TLPs. PCIe implements split transactions, i.e. transactions with request and response separated by time, allowing a link to carry other traffic while the target device gathers data for the response.

In addition PCIe utilizes credit-based flow control. In this scheme, a device advertises an initial amount of credit for each of the receive buffers in Transaction Layer 805. An external device at the opposite end of the link, such as controller hub 715 in FIG. 7, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe devices. Transactions to the configuration space include read requests and write requests. Message space transactions (or, simply messages) are defined to support in-band communication between PCIe agents.

Therefore, in one embodiment, transaction layer 805 assembles packet header/payload 706. Format for current packet headers/payloads may be found in the PCIe specification at the PCIe specification website.

Figure 9:
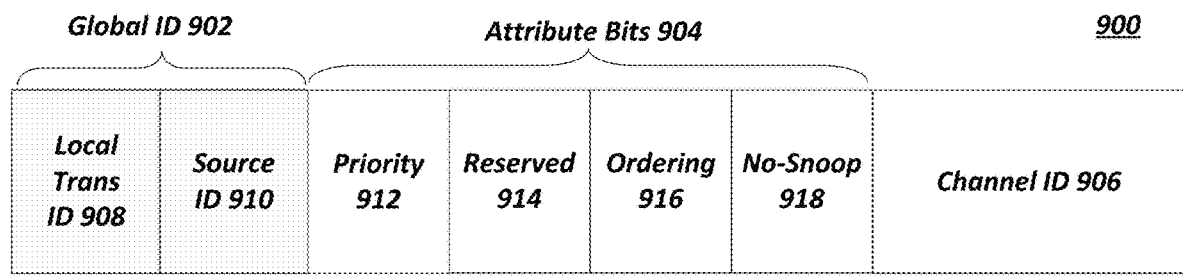
FIG. 9 illustrates an embodiment of a request or packet to be generated or received within an interconnect architecture.

Quickly referring to FIG. 9, an embodiment of a PCIe transaction descriptor is illustrated. In one embodiment, transaction descriptor 900 is a mechanism for carrying transaction information. In this regard, transaction descriptor 900 supports identification of transactions in a system. Other potential uses include tracking modifications of default transaction ordering and association of transaction with channels.

Transaction descriptor 900 includes global identifier field 902, attributes field 904, and channel identifier field 906. In the illustrated example, global identifier field 902 is depicted comprising local transaction identifier field 908 and source identifier field 910. In one embodiment, global transaction identifier 902 is unique for all outstanding requests.

According to one implementation, local transaction identifier field 908 is a field generated by a requesting agent, and it is unique for all outstanding requests that require a completion for that requesting agent. Furthermore, in this example, source identifier 810 uniquely identifies the requestor agent within a PCIe hierarchy. Accordingly, together with source ID 910, local transaction identifier 908 field provides global identification of a transaction within a hierarchy domain.

Attributes field 904 specifies characteristics and relationships of the transaction. In this regard, attributes field 904 is potentially used to provide additional information that allows modification of the default handling of transactions. In one embodiment, attributes field 904 includes priority field 912, reserved field 914, ordering field 916, and no-snoop field 918. Here, priority sub-field 912 may be modified by an initiator to assign a priority to the transaction. Reserved attribute field 914 is left reserved for future, or vendor-defined usage. Possible usage models using priority or security attributes may be implemented using the reserved attribute field.

In this example, ordering attribute field 916 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 918 is utilized to determine if transactions are snooped. As shown, channel ID Field 906 identifies a channel that a transaction is associated with.

Link Layer

Link layer 810, also referred to as data link layer 810, acts as an intermediate stage between transaction layer 805 and the physical layer 820. In one embodiment, a responsibility of the data link layer 810 is providing a reliable mechanism for exchanging Transaction Layer Packets (TLPs) between two components a link. One side of the Data Link Layer 810 accepts TLPs assembled by the Transaction Layer 805, applies packet sequence identifier 811, i.e. an identification number or packet number, calculates and applies an error detection code, i.e. CRC 812, and submits the modified TLPs to the Physical Layer 820 for transmission across a physical to an external device.

Physical Layer

In one embodiment, physical layer 820 includes logical sub block 821 and electrical sub-block 822 to physically transmit a packet to an external device. Here, logical sub-block 821 is responsible for the "digital" functions of Physical Layer 821. In this regard, the logical sub-block includes a transmit section to prepare outgoing information for transmission by physical sub-block 822, and a receiver section to identify and prepare received information before passing it to the Link Layer 810.

Physical block 822 includes a transmitter and a receiver. The transmitter is supplied by logical sub-block 821 with symbols, which the transmitter serializes and transmits onto to an external device. The receiver is supplied with serialized symbols from an external device and transforms the received signals into a bit-stream. The bit-stream is de-serialized and supplied to logical sub-block 821. In one embodiment, an 8b/10b transmission code is employed, where ten-bit symbols are transmitted/received. Here, special symbols are used to frame a packet with frames 823. In addition, in one example, the receiver also provides a symbol clock recovered from the incoming serial stream.

As stated above, although transaction layer 805, link layer 810, and physical layer 820 are discussed in reference to a specific embodiment of a PCIe protocol stack, a layered protocol stack is not so limited. In fact, any layered protocol may be included/implemented. As an example, an port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Figure 10:
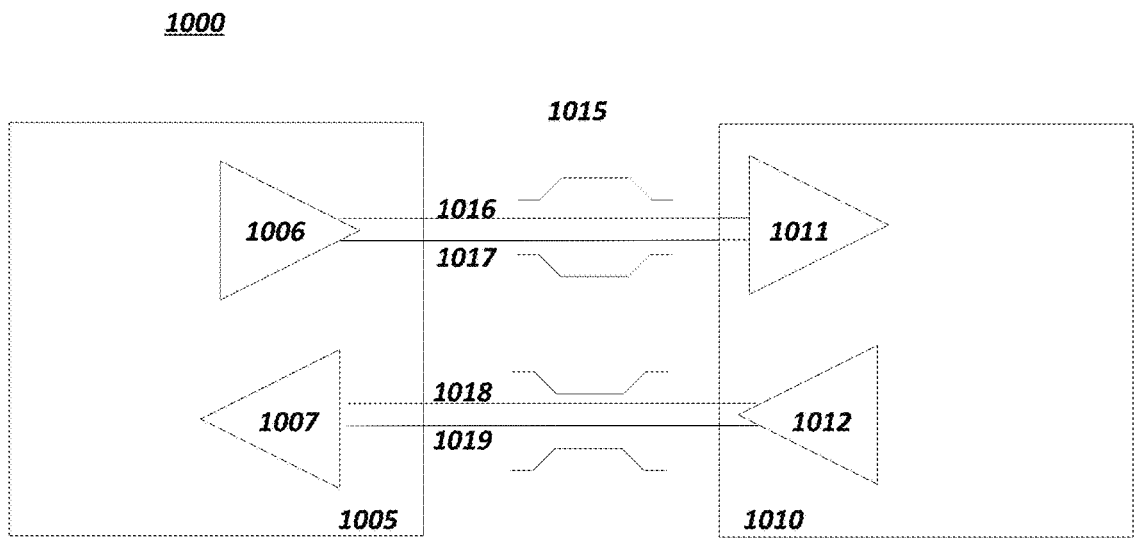
FIG. 10 illustrates an embodiment of a transmitter and receiver pair for an interconnect architecture.

Referring next to FIG. 10, an embodiment of a PCIe serial point to point fabric is illustrated. Although an embodiment of a PCIe serial point-to-point link is illustrated, a serial point-to-point link is not so limited, as it includes any transmission path for transmitting serial data. In the embodiment shown, a basic PCIe link includes two, low-voltage, differentially driven signal pairs: a transmit pair 1006/1011 and a receive pair 1012/1007. Accordingly, device 1005 includes transmission logic 1006 to transmit data to device 1010 and receiving logic 1007 to receive data from device 1010. In other words, two transmitting paths, i.e. paths 1016 and 1017, and two receiving paths, i.e. paths 1018 and 1019, are included in a PCIe link.

A transmission path refers to any path for transmitting data, such as a transmission line, a copper line, an optical line, a wireless communication channel, an infrared communication link, or other communication path. A connection between two devices, such as device 1005 and device 1010, is referred to as a link, such as link 1015. A link may support one lane—each lane representing a set of differential signal pairs (one pair for transmission, one pair for reception). To scale bandwidth, a link may aggregate multiple lanes denoted by xN, where N is any supported Link width, such as 1, 2, 4, 8, 12, 16, 32, 64, or wider.

A differential pair refers to two transmission paths, such as lines 1016 and 1017, to transmit differential signals. As an example, when line 1016 toggles from a low voltage level to a high voltage level, i.e. a rising edge, line 1017 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

Note that the apparatus, methods, and systems described above may be implemented in any electronic device or system as aforementioned. As specific illustrations, the figures below provide exemplary systems for utilizing the disclosure as described herein. As the systems below are described in more detail, a number of different interconnects are disclosed, described, and revisited from the discussion above. And as is readily apparent, the advances described above may be applied to any of those interconnects, fabrics, or architectures.

Figure 11:
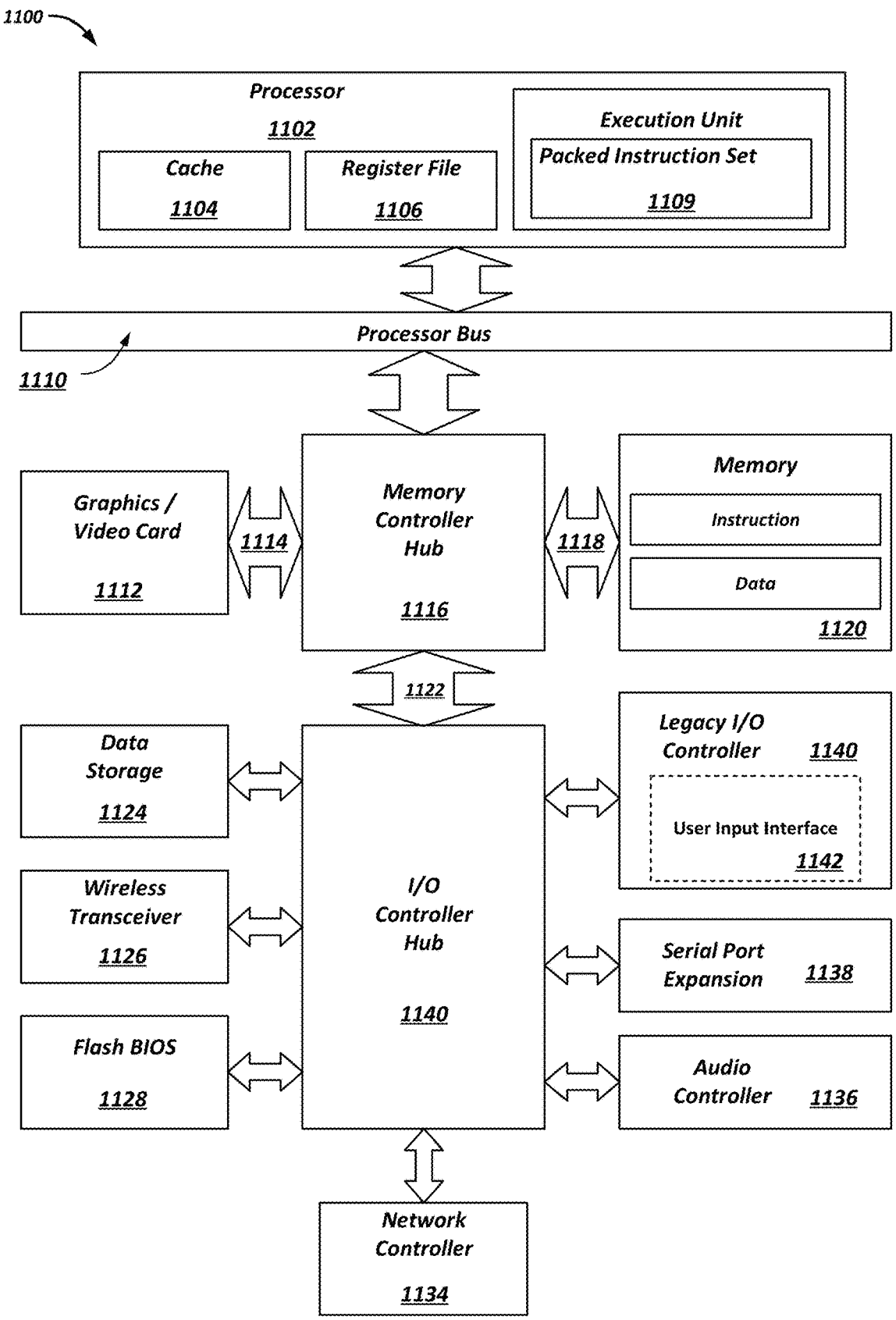
FIG. 11 illustrates another embodiment of a block diagram for a computing system including a processor.

Turning to FIG. 11, a block diagram of an exemplary computer system formed with a processor that includes execution units to execute an instruction, where one or more of the interconnects implement one or more features in accordance with one embodiment of the present disclosure is illustrated. System 1100 includes a component, such as a processor 1102 to employ execution units including logic to perform algorithms for process data, in accordance with the present disclosure, such as in the embodiment described herein. System 1100 is representative of processing systems based on the PENTIUM III™, PENTIUM 4™, Xeon™ Itanium, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 1000 executes a version of the WINDOWS™ operating system available from Microsoft Corporation of Redmond, Wash., although other operating systems (UNIX and Linux for example), embedded software, and/or graphical user interfaces, may also be used. Thus, embodiments of the present disclosure are not limited to any specific combination of hardware circuitry and software.

Embodiments are not limited to computer systems. Alternative embodiments of the present disclosure can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

In this illustrated embodiment, processor 1102 includes one or more execution units 1008 to implement an algorithm that is to perform at least one instruction. One embodiment may be described in the context of a single processor desktop or server system, but alternative embodiments may be included in a multiprocessor system. System 1100 is an example of a 'hub' system architecture. The computer system 1100 includes a processor 1102 to process data signals. The processor 1102, as one illustrative example, includes a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 1102 is coupled to a processor bus 1110 that transmits data signals between the processor 1102 and other components in the system 1100. The elements of system 1100 (e.g. graphics accelerator 1112, memory controller hub 1116, memory 1120, I/O controller hub 1124, wireless transceiver 1126, Flash BIOS 1028, Network controller 1134, Audio controller 1136, Serial expansion port 1138, I/O controller 1140, etc.) perform their conventional functions that are well known to those familiar with the art.

In one embodiment, the processor 1102 includes a Level 1 (L1) internal cache memory 1104. Depending on the architecture, the processor 1102 may have a single internal cache or multiple levels of internal caches. Other embodiments include a combination of both internal and external caches depending on the particular implementation and needs. Register file 1106 is to store different types of data in various registers including integer registers, floating point registers, vector registers, banked registers, shadow registers, checkpoint registers, status registers, and instruction pointer register.

Execution unit 1108, including logic to perform integer and floating point operations, also resides in the processor 1102. The processor 1102, in one embodiment, includes a microcode (ucode) ROM to store microcode, which when executed, is to perform algorithms for certain macroinstructions or handle complex scenarios. Here, microcode is potentially updateable to handle logic bugs/fixes for processor 1102. For one embodiment, execution unit 1108 includes logic to handle a packed instruction set 1109. By including the packed instruction set 1109 in the instruction set of a general-purpose processor 1102, along with associated circuitry to execute the instructions, the operations used by many multimedia applications may be performed using packed data in a general-purpose processor 1102. Thus, many multimedia applications are accelerated and executed more efficiently by using the full width of a processor's data bus for performing operations on packed data. This potentially eliminates the need to transfer smaller units of data across the processor's data bus to perform one or more operations, one data element at a time.

Alternate embodiments of an execution unit 1108 may also be used in micro controllers, embedded processors, graphics devices, DSPs, and other types of logic circuits. System 1100 includes a memory 1120. Memory 1020 includes a dynamic random access memory (DRAM) device, a static random access memory (SRAM) device, flash memory device, or other memory device. Memory 1120 stores instructions and/or data represented by data signals that are to be executed by the processor 1102.

Note that any of the aforementioned features or aspects of the disclosure may be utilized on one or more interconnect illustrated in FIG. 11. For example, an on-die interconnect (ODI), which is not shown, for coupling internal units of processor 1102 implements one or more aspects of the disclosure described above. Or the disclosure is associated with a processor bus 1110 (e.g. Intel Quick Path Interconnect (QPI) or other known high performance computing interconnect), a high bandwidth memory path 1118 to memory 1120, a point-to-point link to graphics accelerator 1112 (e.g. a Peripheral Component Interconnect express (PCIe) compliant fabric), a controller hub interconnect 1122, an I/O or other interconnect (e.g. USB, PCI, PCIe) for coupling the other illustrated components. Some examples of such components include the audio controller 1136, firmware hub (flash BIOS) 1128, wireless transceiver 1126, data storage 1124, legacy I/O controller 1110 containing user input and keyboard interfaces 1142, a serial expansion port 1138 such as Universal Serial Bus (USB), and a network controller 1134. The data storage device 1124 can comprise a hard disk drive, a floppy disk drive, a CD-ROM device, a flash memory device, or other mass storage device.

Figure 12:
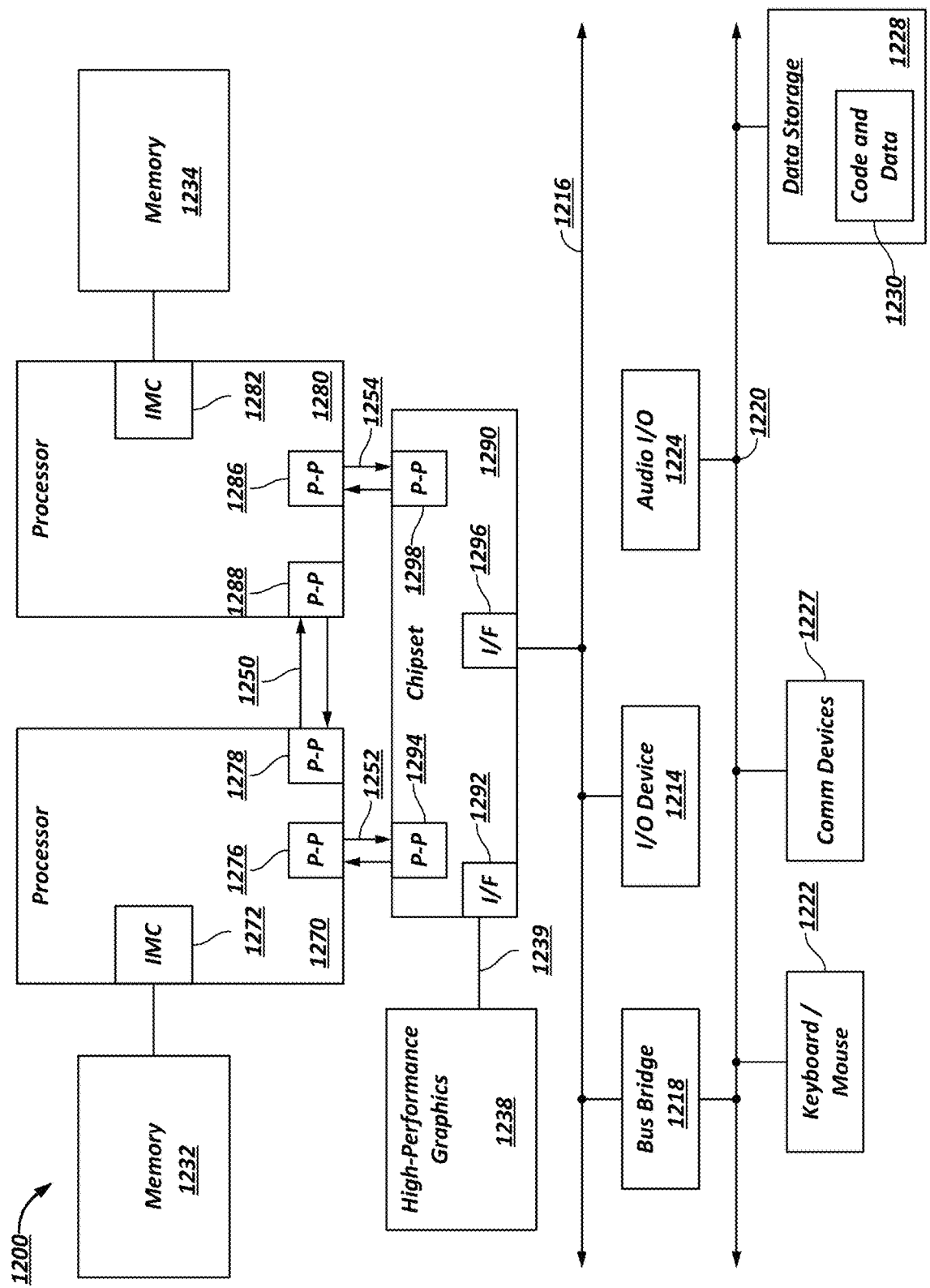
FIG. 12 illustrates an embodiment of a block for a computing system including multiple processor sockets.

Referring now to FIG. 12, shown is a block diagram of a second system 1200 in accordance with an embodiment of the present disclosure. As shown in FIG. 12, multiprocessor system 1200 is a point-to-point interconnect system, and includes a first processor 1270 and a second processor 1280 coupled via a point-to-point interconnect 1250. Each of processors 1270 and 1280 may be some version of a processor. In one embodiment, 1252 and 1254 are part of a serial, point-to-point coherent interconnect fabric, such as Intel's Quick Path Interconnect (QPI) architecture. As a result, the disclosure may be implemented within the QPI architecture.

While shown with only two processors 1270, 1280, it is to be understood that the scope of the present disclosure is not so limited. In other embodiments, one or more additional processors may be present in a given processor.

Processors 1270 and 1280 are shown including integrated memory controller units 1272 and 1282, respectively. Processor 1270 also includes as part of its bus controller units point-to-point (P-P) interfaces 1276 and 1278; similarly, second processor 1280 includes P-P interfaces 1286 and 1288. Processors 1270, 1280 may exchange information via a point-to-point (P-P) interface 1250 using P-P interface circuits 1278, 1288. As shown in FIG. 12, IMCs 1272 and 1282 couple the processors to respective memories, namely a memory 1232 and a memory 1234, which may be portions of main memory locally attached to the respective processors.

Processors 1270, 1280 each exchange information with a chipset 1290 via individual P-P interfaces 1252, 1254 using point to point interface circuits 1276, 1294, 1286, 1298. Chipset 1290 also exchanges information with a high-performance graphics circuit 1138 via an interface circuit 1292 along a high-performance graphics interconnect 1239.

A shared cache (not shown) may be included in either processor or outside of both processors; yet connected with the processors via P-P interconnect, such that either or both processors' local cache information may be stored in the shared cache if a processor is placed into a low power mode.

Chipset 1290 may be coupled to a first bus 1216 via an interface 1296. In one embodiment, first bus 1216 may be a Peripheral Component Interconnect (PCI) bus, or a bus such as a PCI Express bus or another third generation I/O interconnect bus, although the scope of the present disclosure is not so limited.

As shown in FIG. 12, various I/O devices 1214 are coupled to first bus 1216, along with a bus bridge 1218 which couples first bus 1216 to a second bus 1220. In one embodiment, second bus 1220 includes a low pin count (LPC) bus. Various devices are coupled to second bus 1220 including, for example, a keyboard and/or mouse 1222, communication devices 1227 and a storage unit 1228 such as a disk drive or other mass storage device which often includes instructions/code and data 1230, in one embodiment. Further, an audio I/O 1224 is shown coupled to second bus 1220. Note that other architectures are possible, where the included components and interconnect architectures vary. For example, instead of the point-to-point architecture of FIG. 12, a system may implement a multi-drop bus or other such architecture.

Using the various inertial and environmental sensors present in a platform, many different use cases may be realized. These use cases enable advanced computing operations including perceptual computing and also allow for enhancements with regard to power management/battery life, security, and system responsiveness.

For example with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second the screen provides visual feedback to the user that the user has transitioned into a new state. Transition to a third screen may occur in a third state in which the user has confirmed recognition of the user.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

In an embodiment, the OS may be a Microsoft® Windows® 8 OS that implements Connected Standby (also referred to herein as Win8 CS). Windows 8 Connected Standby or another OS having a similar state can provide, via a platform as described herein, very low ultra idle power to enable applications to remain connected, e.g., to a cloud-based location, at very low power consumption. The platform can supports 3 power states, namely screen on (normal); Connected Standby (as a default "off" state); and shutdown (zero watts of power consumption). Thus in the Connected Standby state, the platform is logically on (at minimal power levels) even though the screen is off. In such a platform, power management can be made to be transparent to applications and maintain constant connectivity, in part due to offload technology to enable the lowest powered component to perform an operation.

While this disclosure has been described with respect to a limited number of embodiments, those skilled in the art will appreciate numerous modifications and variations therefrom. It is intended that the appended claims cover all such modifications and variations as fall within the true spirit and scope of this present disclosure.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase "to" or "configured to," in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Example 1 is apparatus comprising a receiver port coupled to a first link partner across a first link; a transmitter port coupled to a second link partner across a second link; and a power management controller implemented at least partially in hardware to detect one or more power management control signals, determine a power management state for the apparatus based, at least in part, at least one of the one or more power management control signals, and cause the apparatus to enter the power management state. The apparatus to transmit electrical signals to the second link partner based on the power management state.

Example 2 may include the subject matter of example 1, wherein the apparatus comprises a re-driver.

Example 3 may include the subject matter of any of examples 1-2, wherein the one or more power management control signals comprises an electrical idle (EI) signal received at the apparatus or a common mode voltage signal (Vtx_cm) maintained with the transmitter of the first link partner.

Example 4 may include the subject matter of example 3, wherein the apparatus is to enter a power management state based on one or more of a detection or absence of the EI signal or the maintenance or non-maintenance the Vtx_cm.

Example 5 may include the subject matter of any of examples 1-4, wherein the apparatus performs active forwarding when no EI is detected.

Example 6 may include the subject matter of any of examples 1-4, wherein the apparatus enters a standby state when the EI signal is detected and Vtx_cm is maintained.

Example 7 may include the subject matter of any of examples 1-4, wherein the apparatus enters a low power state when the EI signal is detected and Vtx_cm is not maintained.

Example 8 may include the subject matter of any of examples 1-7, wherein the apparatus is based on a universal serial bus (USB) interconnect protocol; and the power management state corresponding to a power management link state associated with the USB interconnect protocol.

Example 9 may include the subject matter of any of examples 1-7, wherein the one or more power management control signals comprises a clock request (CLKREQ#) signal; and wherein the apparatus is to enter a power management state based on a detection or absence of one or more of the CLKREQ# signal or the EI signal or the Vtx_cm is maintained.

Example 10 may include the subject matter of any of examples 1-7 and 9, wherein apparatus is based on a Peripheral Component Interconnect Express protocol.

Example 11 may include the subject matter of any of examples 1-10, wherein the power management state corresponds to a power management link state associated with an interconnect protocol.

Example 12 may include the subject matter of any of examples 1-11, wherein the power management state comprises one of an active state, a standby state, or a low power state.

Example 13 may include the subject matter of any of examples 1-7 and 9-12, wherein the apparatus is compliant with a Peripheral Component Interconnect Express (PCIe) protocol, and wherein the active state corresponds to an L0 power management link state associated with the PCIe protocol; the standby state corresponds to an L0s and L1.0 short latency power management link state associated with the PCIe protocol; and the low power state corresponds to either an L1.0 long latency and L1.1 power management link state or an L1.2 and L2 power management link state associated with the PCIe protocol.

Example 14 may include the subject matter of any of examples 1-8 and 11-12, wherein the apparatus is compliant with a Universal Serial Bus (USB) interconnect protocol, and wherein the active state corresponds to a U0 power management link state associated with the USB protocol; the standby state corresponds to a U1 power management link state associated with the USB protocol; and the low power state corresponds to a U2/U3 power management link state associated with the USB protocol.

Example 15 is a method performed at a re-driver comprising receiving at the re-driver one or more power management change signals; identifying a power management state for the re-driver based at on the received power management change signals; entering the identified power management state.

Example 16 may include the subject matter of example 15, wherein the one or more power management change signals comprises an electrical idle signal or a common mode voltage.

Example 17 may include the subject matter of any of examples 15-16, wherein the one or more power management change signals comprises a clock request (CLKREQ#) signal.

Example 18 may include the subject matter of any of examples 15-17, further comprising receiving an electrical idle signal; and entering a low power state based on receiving an electrical idle signal.

Example 19 may include the subject matter of any of examples 15-18, further comprising receiving a clock request (CLKREQ#) signal on a sideband link; entering a standby power management state based on receiving the electrical idle signal and the CLKREQ# signal.

Example 20 may include the subject matter of any of examples 15-18, further comprising receiving a common mode voltage associated with a transmitter upstream of the re-driver; determining that the common mode voltage is maintained; and entering a low-power power management state based on the common mode voltage being maintained.

Example 21 is a system comprising a baseboard comprising a first computing device electrically and physically coupled to the baseboard; and a re-driver device electrically coupled to the first computing device downstream of the first computing device, the re-driver comprising a power management (PM) controller logic; The system also includes an add-in card (AIC) electrically coupled to the baseboard by a connector, the AIC comprising a second computing device electrically coupled to the re-driver on the baseboard. The PM controller logic to receive one or more re-driver PM control signals; determine a PM state for the re-driver based at least in part on the received one or more PM control signals; and cause the re-driver to operate in the PM state based on the received one or more PM control signals Example 22 may include the subject matter of example 21, wherein the one or more power management change signals comprises an electrical idle signal or a common mode voltage.

Example 23 may include the subject matter of any of examples 21-22, the PM controller to receive an electrical idle signal; and enter a low power state based on receiving an electrical idle signal.

Example 24 may include the subject matter of any of examples 21-22, wherein the one or more power management change signals comprises a clock request (CLKREQ#) signal.

Example 25 may include the subject matter of example 24, the PM controller to receive a clock request (CLKREQ#) signal on a sideband link; enter a standby power management state based on receiving the electrical idle signal and the CLKREQ# signal.

Example 26 is an apparatus that includes a receiver port coupled to a first link partner across a first link; a transmitter port coupled to a second link partner across a second link; and a means for detecting one or more power management control signals, means for determining a power management state for the apparatus based, at least in part, at least one of the one or more power management control signals, and means for causing the apparatus to enter the power management state. The apparatus to transmit electrical signals to the second link partner based on the power management state.

The foregoing description of one or more implementations provides illustration and description, but is not intended to be exhaustive or to limit the scope of embodiments to the precise form disclosed. Modifications and variations are possible in light of the above teachings or may be acquired from practice of various embodiments.

What is claimed is:

1. An apparatus comprising:
   a receiver port coupled to a first link partner across a first link;
   a transmitter port coupled to a second link partner across a second link; and
   a power management controller implemented in hardware to:
      detect a power management control signal comprising a common mode voltage signal (Vtx_cm) detected at a Vtx_cm detector at the receiver port,
      determine a power management state for the apparatus based on the common mode voltage signal, and
      cause the apparatus to enter the power management state; and
   the apparatus to transmit electrical signals to the second link partner based on the power management state.

2. The apparatus of claim 1, wherein the apparatus comprises a re-driver.

3. The apparatus of claim 1, wherein the power management control signal comprises an electrical idle (EI) signal determined by a squelch detector at the apparatus.

4. The apparatus of claim 3, wherein to determine a power management state for the apparatus comprises to determine a power management state for the apparatus based on the common mode voltage signal and the EI signal.

5. The apparatus of claim 4, wherein the apparatus performs active forwarding in response to no detection of EI.

6. The apparatus of claim 4, wherein the apparatus enters a standby state in response to detection of the EI signal and detection that the Vtx_cm is maintained.

7. The apparatus of claim 4, wherein the apparatus enters a low power state in response to detection of the EI signal and detection that the Vtx_cm is not maintained.

8. The apparatus of claim 4, wherein the apparatus is based on a universal serial bus (USB) interconnect protocol; and
   the power management state corresponding to a power management link state associated with the USB interconnect protocol.

9. The apparatus of claim 4, wherein the power management control signal comprises a clock request (CLKREQ#) signal sent from the first link partner to a clock generator; and
   wherein the apparatus is to enter a power management state based on a detection or absence of the CLKREQ# signal or the EI signal or that the Vtx_cm is maintained.

10. The apparatus of claim 9, wherein the apparatus is based on a Peripheral Component Interconnect Express protocol.

11. The apparatus of claim 1, wherein the power management state corresponds to a power management link state associated with an interconnect protocol.

12. The apparatus of claim 1, wherein the power management state comprises an active state, a standby state, or a low power state.

13. The apparatus of claim 12, wherein the apparatus is compliant with a Peripheral Component Interconnect Express (PCIe) protocol, and wherein:
   the active state corresponds to an L0 power management link state associated with the PCIe protocol;
   the standby state corresponds to an L0s and L1.0 short latency power management link state associated with the PCIe protocol; and
   the low power state corresponds to either an L1.0 long latency and L1.1 power management link state or an L1.2 and L2 power management link state associated with the PCIe protocol.

14. The apparatus of claim 12, wherein the apparatus is compliant with a Universal Serial Bus (USB) interconnect protocol, and wherein:
   the active state corresponds to a U0 power management link state associated with the USB protocol;
   the standby state corresponds to a U1 power management link state associated with the USB protocol; and
   the low power state corresponds to a U2/U3 power management link state associated with the USB protocol.

15. A method performed at a re-driver comprising:
   receiving at the re-driver a power management change signal;
   identifying a power management state for the re-driver based on the received power management change signal;
   entering the identified power management state;
   receiving an electrical idle signal;
   entering a low power state based on receiving the electrical idle signal;
   receiving a common mode voltage associated with a transmitter upstream of the re-driver;
   determining that the common mode voltage is maintained; and
   entering a low-power power management state based on the common mode voltage being maintained.

16. The method of claim 15, wherein the power management change signal comprises a clock request (CLKREQ#) signal.

17. The method of claim 15, further comprising:
   tapping a clock request (CLKREQ#) signal;
   entering a standby power management state based on receiving the electrical idle signal and the CLKREQ# signal.

18. A system comprising:
   a baseboard comprising:
      a first computing device electrically and physically coupled to the baseboard;
      a re-driver device electrically coupled to the first computing device downstream of the first computing device, the re-driver device comprising a power management (PM) controller logic;
   an add-in card (AIC) electrically coupled to the baseboard by a connector, the AIC comprising:
      a second computing device electrically coupled to the re-driver device on the baseboard;
   the PM controller logic to:
      receive a re-driver PM control signal comprising a common mode voltage signal of a receiver port of the re-driver device;
      determine a PM state for the re-driver device based on the common mode voltage signal;
      cause the re-driver device to operate in the PM state based on the common mode voltage signal.

19. The system of claim 18, wherein the PM control signal comprises an electrical idle signal.

20. The system of claim 19, the PM controller to:
   receive an electrical idle signal; and
   enter a low power state based on receiving an electrical idle signal.

21. The system of claim 19, wherein the PM control signal comprises a clock request (CLKREQ#) signal.

22. The system of claim 21, the PM controller to:
receive a clock request (CLKREQ#) signal on a sideband link;
enter a standby PM state based on receiving the electrical idle signal and the CLKREQ# signal.

* * * * *